(12) United States Patent
Hanada et al.

(10) Patent No.: US 11,367,664 B2
(45) Date of Patent: Jun. 21, 2022

(54) SEMICONDUCTOR DEVICES AND METHODS OF MANUFACTURING SEMICONDUCTOR DEVICES

(71) Applicant: AMKOR TECHNOLOGY JAPAN, INC., Oita (JP)

(72) Inventors: Shojiro Hanada, Kanagawa (JP); Shingo Nakamura, Kanagawa (JP)

(73) Assignee: Amkor Technology Japan, Inc., Oita (JP)

( * ) Notice: Subject to any disclaimer, the term of this patent is extended or adjusted under 35 U.S.C. 154(b) by 3 days.

(21) Appl. No.: 16/720,603

(22) Filed: Dec. 19, 2019

(65) Prior Publication Data

US 2021/0193539 A1    Jun. 24, 2021

(51) Int. Cl.
| | |
|---|---|
| *H01L 23/10* | (2006.01) |
| *H01L 23/20* | (2006.01) |
| *H01L 23/13* | (2006.01) |
| *H01L 21/54* | (2006.01) |
| *H01L 23/498* | (2006.01) |
| *H01L 23/00* | (2006.01) |
| *F16K 99/00* | (2006.01) |

(52) U.S. Cl.
CPC ............. *H01L 23/10* (2013.01); *H01L 21/54* (2013.01); *H01L 23/13* (2013.01); *H01L 23/20* (2013.01); *F16K 99/0005* (2013.01); *F16K 99/0023* (2013.01); *F16K 99/0032* (2013.01); *F16K 99/0036* (2013.01); *H01L 23/49827* (2013.01); *H01L 23/49838* (2013.01); *H01L 24/48* (2013.01); *H01L 2224/48091* (2013.01); *H01L 2224/48106* (2013.01); *H01L 2224/48229* (2013.01)

(58) Field of Classification Search
CPC ... H01L 21/50; H01L 21/54; H01L 23/02–16; H01L 23/20; H01L 23/49827; H01L 23/49838; H01L 24/48; F16K 99/0005; F16K 99/0023; F16K 99/0032; F16K 99/0036

See application file for complete search history.

(56) References Cited

U.S. PATENT DOCUMENTS

| | | | | |
|---|---|---|---|---|
| 2005/0184382 | A1* | 8/2005 | Chen | B81C 1/00293 257/698 |
| 2012/0106085 | A1* | 5/2012 | Yamazaki | G01J 5/029 361/705 |
| 2014/0008738 | A1* | 1/2014 | Morris, III | B81B 7/02 257/415 |
| 2014/0022718 | A1* | 1/2014 | Yamazaki | G01J 5/045 361/679.01 |
| 2016/0304338 | A1* | 10/2016 | Saint-Patrice | B81C 1/00293 |
| 2021/0193539 | A1* | 6/2021 | Hanada | F16K 1/32 |

FOREIGN PATENT DOCUMENTS

JP    2008235502 A   * 10/2008   ............. H01L 24/48

* cited by examiner

*Primary Examiner* — Andres Munoz
(74) *Attorney, Agent, or Firm* — Spectrum IP Law Group LLC

(57) ABSTRACT

In one example, a semiconductor device comprises a cavity substrate comprising a base and a sidewall to define a cavity, an electronic component on a top side of the base in the cavity, a lid over the cavity and over the sidewall, and a valve to provide access to the cavity, wherein the valve has a plug to provide a seal between a cavity environment and an exterior environment outside the cavity. Other examples and related methods are also disclosed herein.

21 Claims, 26 Drawing Sheets

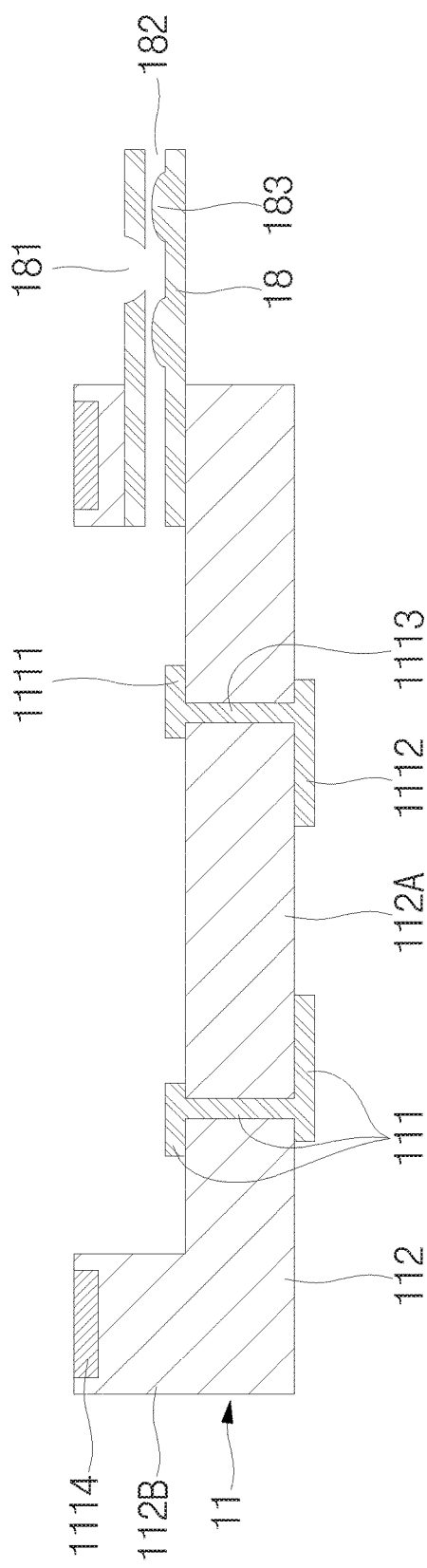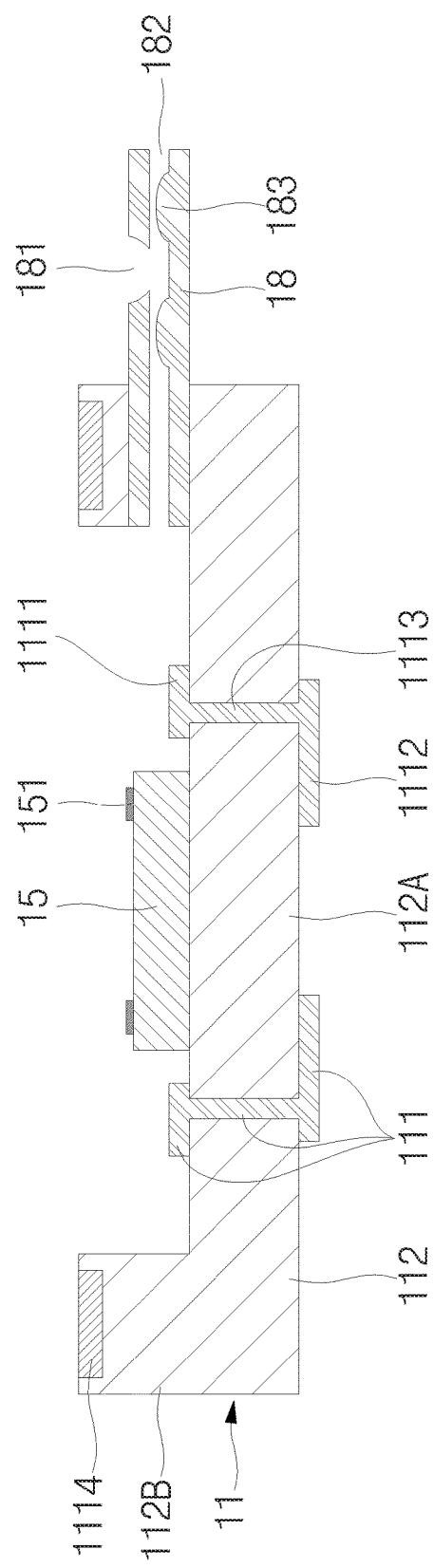

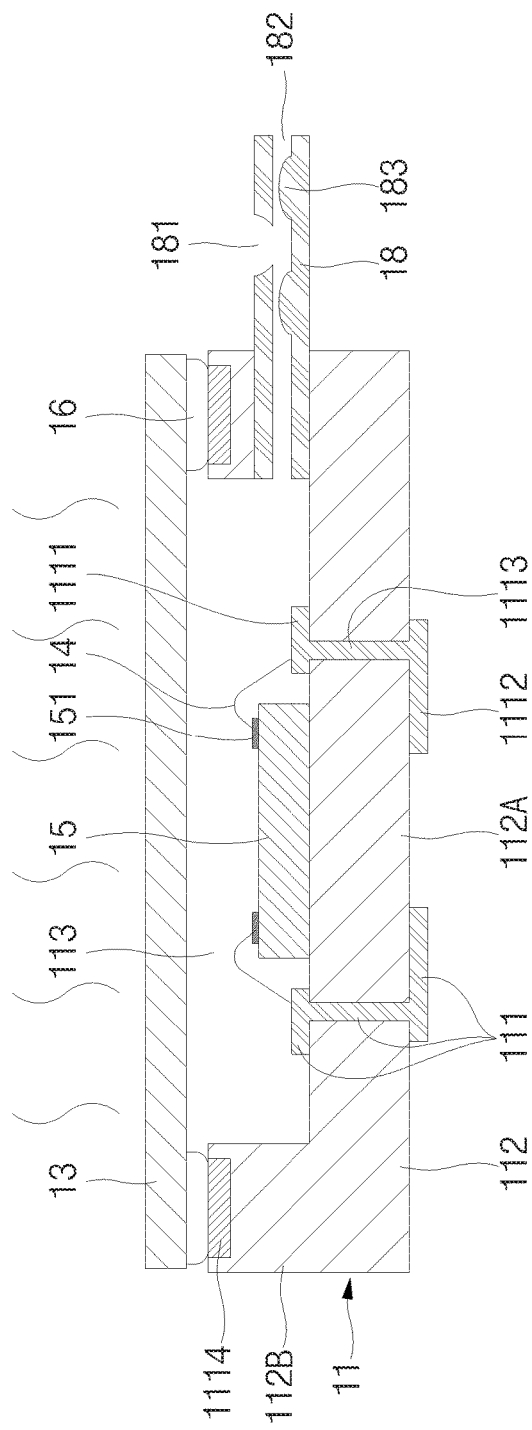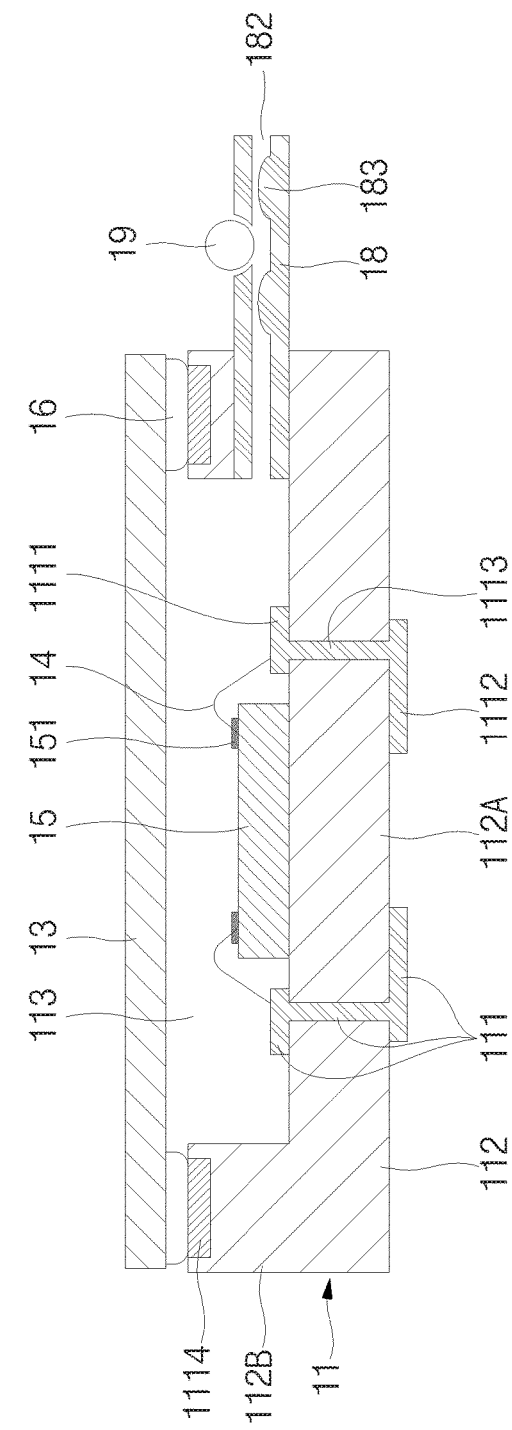

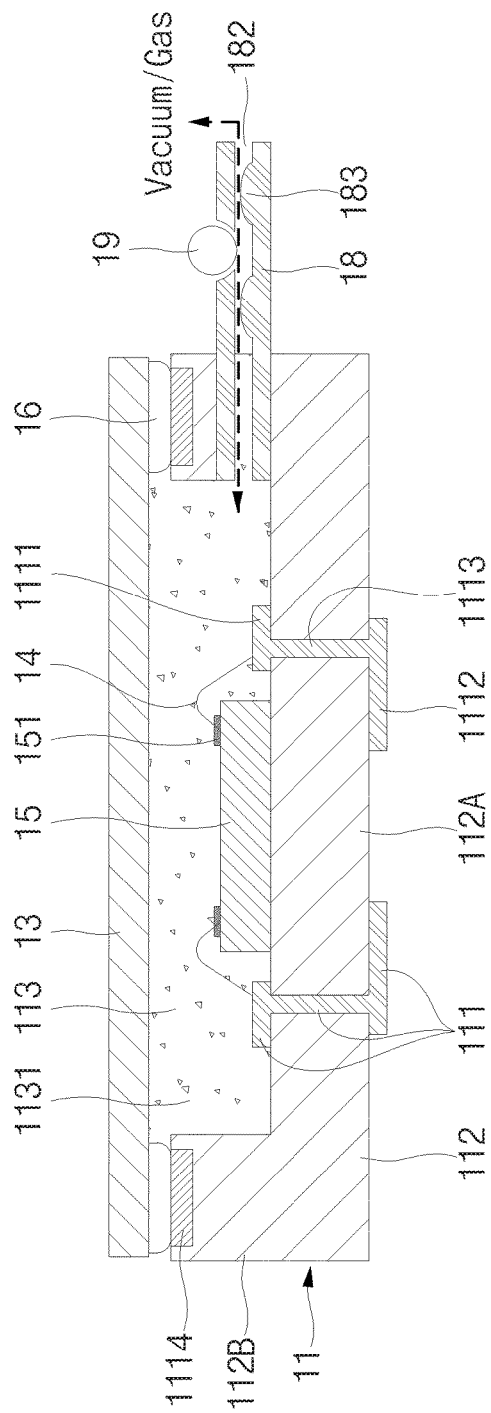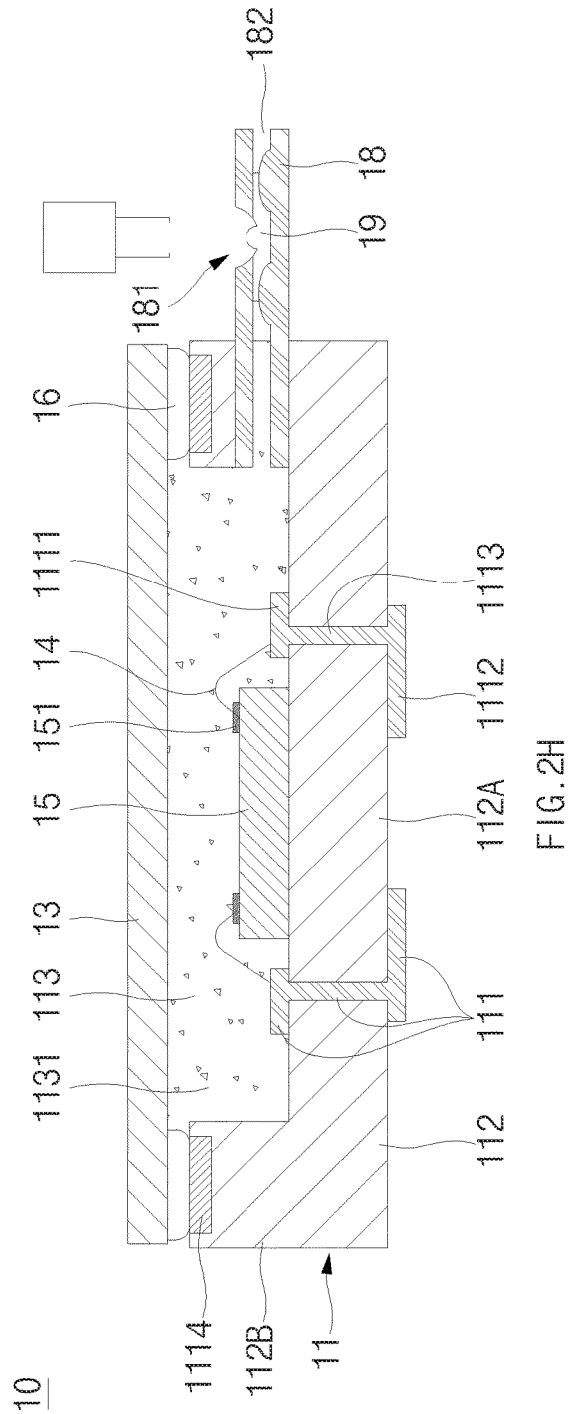

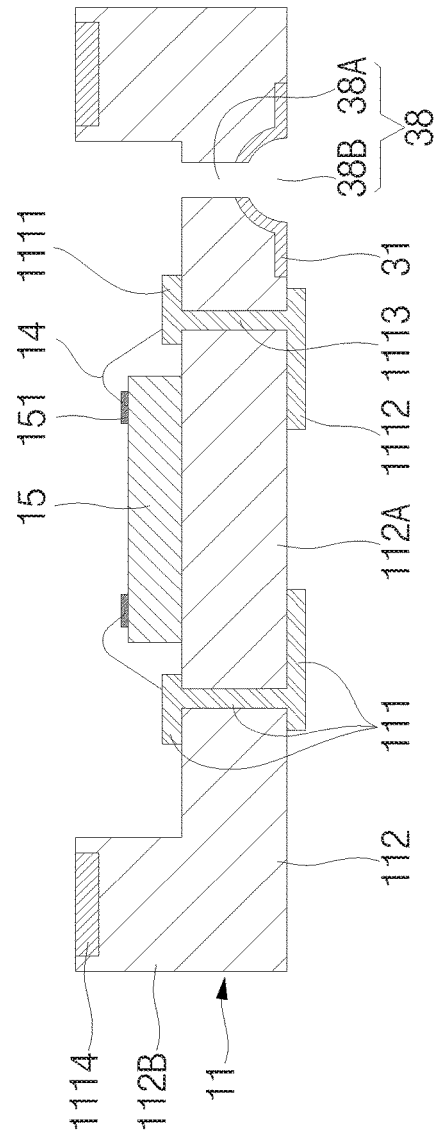
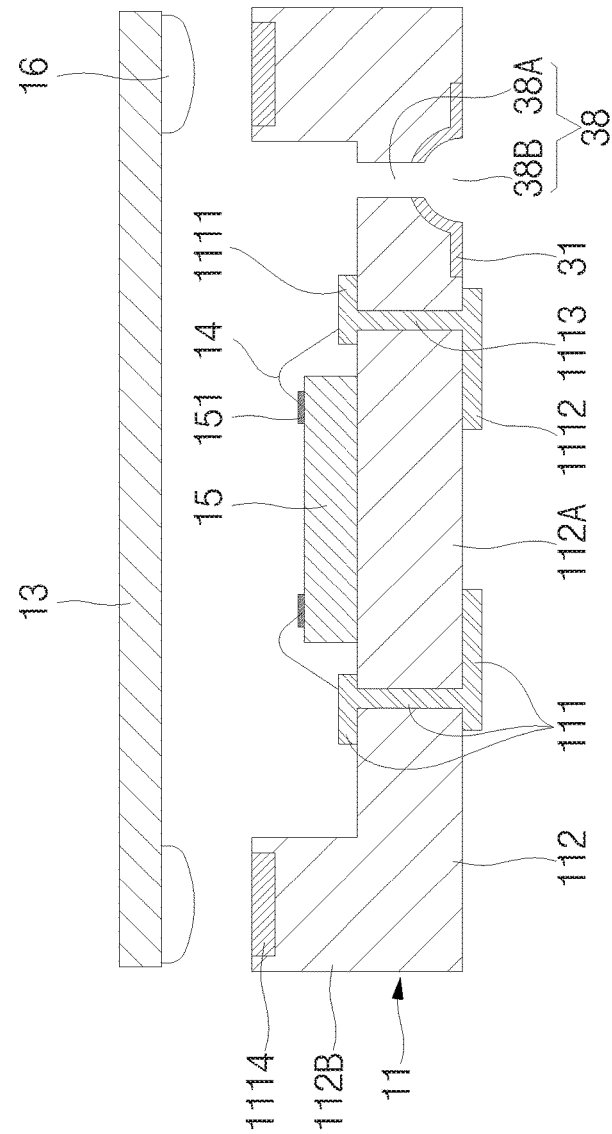
FIG.7C
FIG.7D

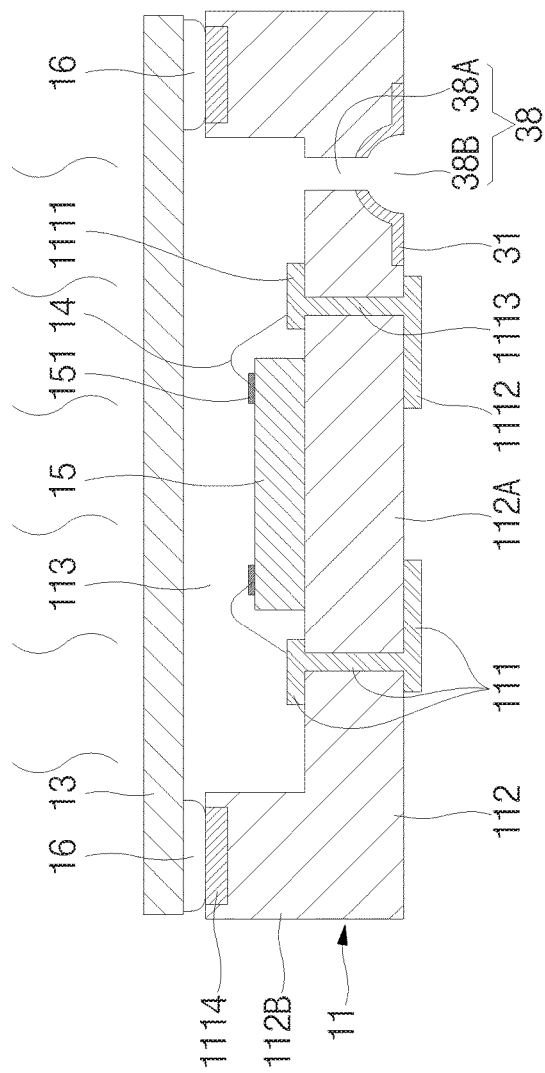
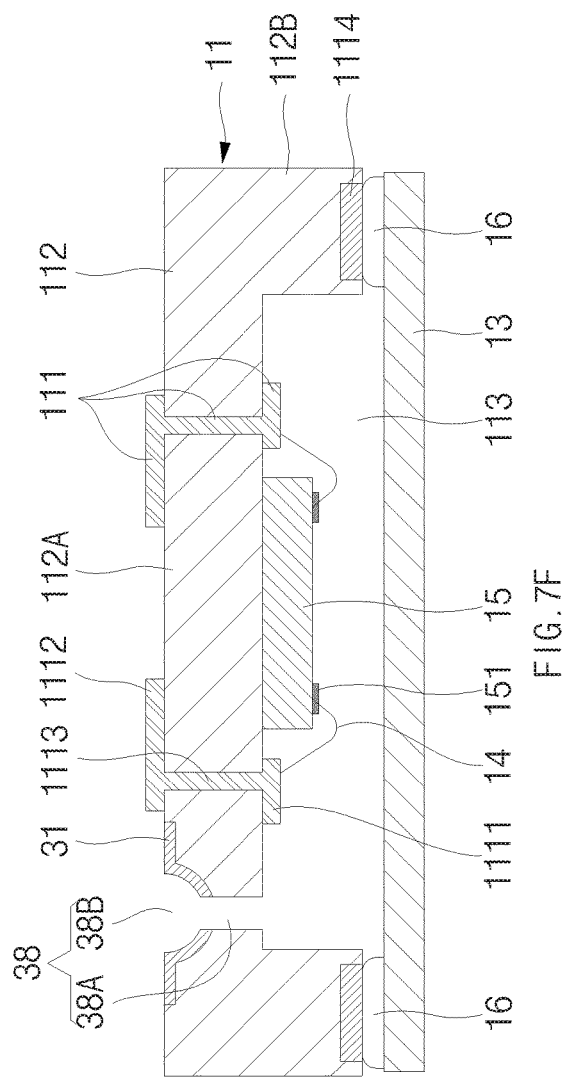
FIG.7E
FIG.7F

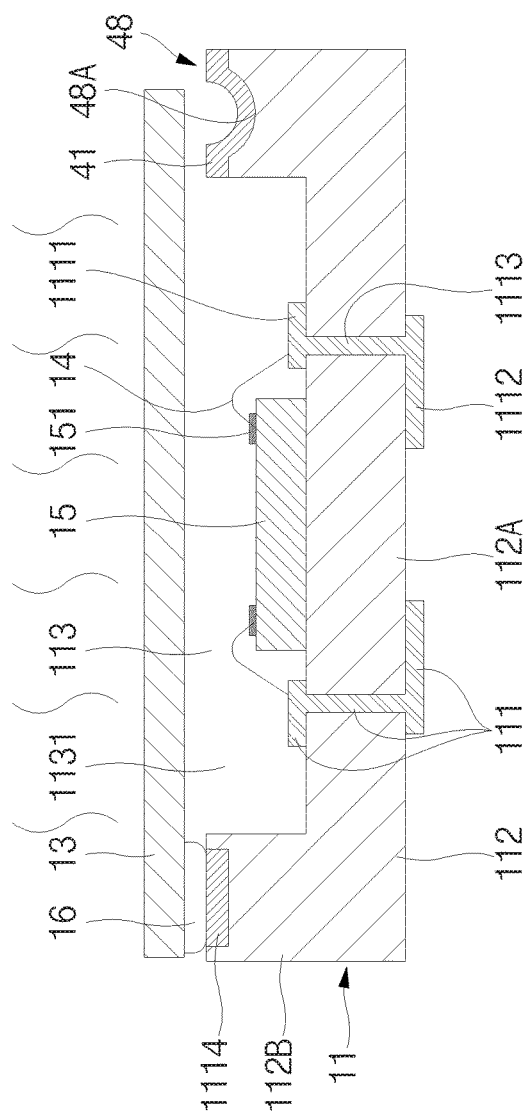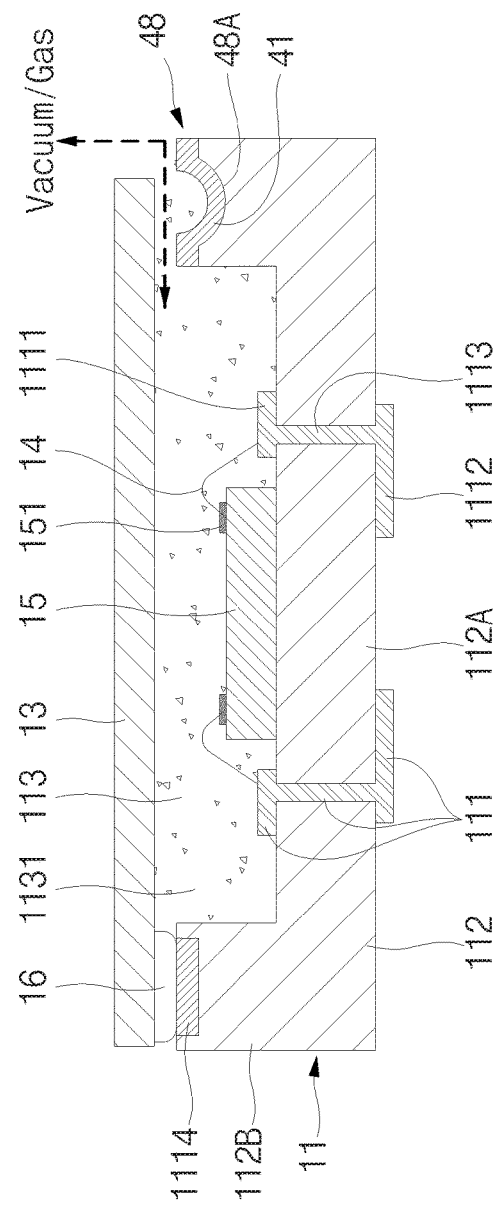

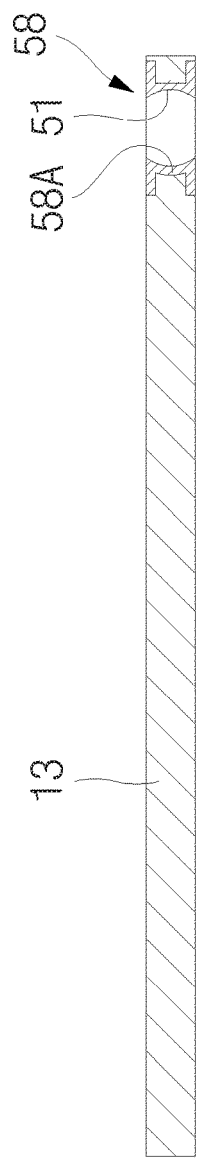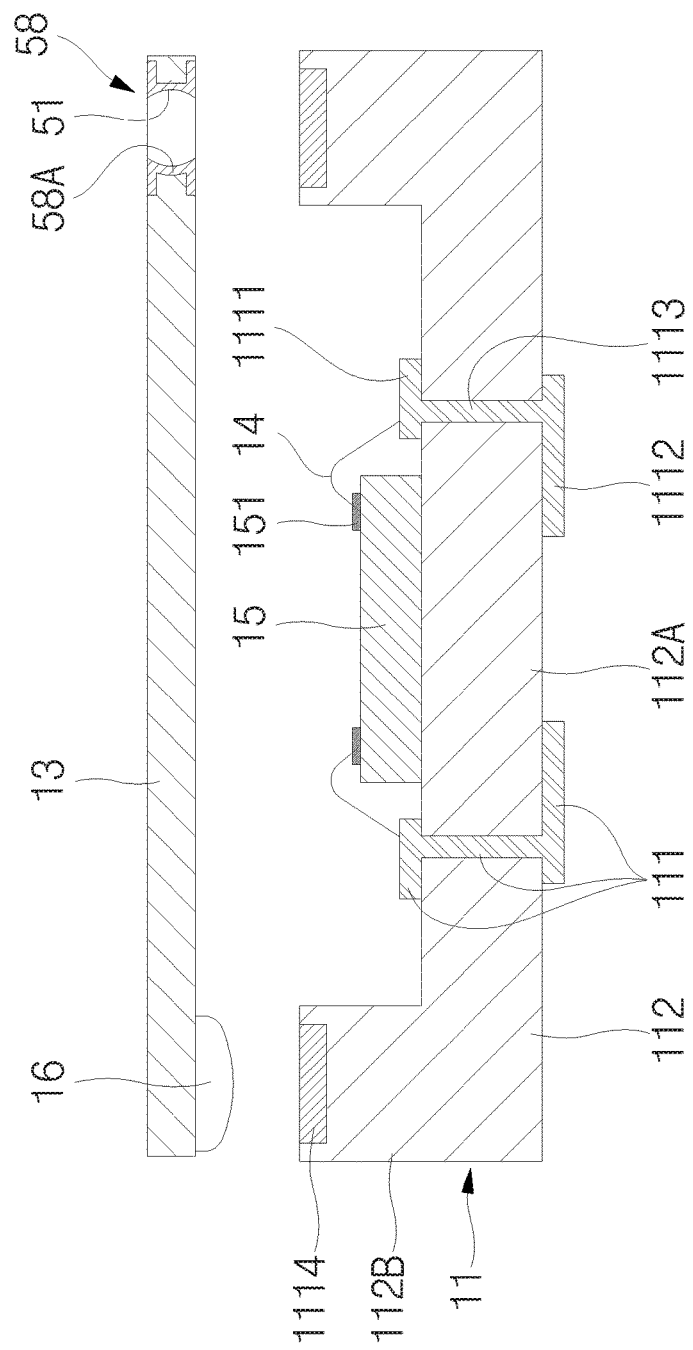
FIG.11A
FIG.11B

US 11,367,664 B2

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2H show cross-sectional views of an example method for manufacturing an example semiconductor device.

FIGS. 7A to 7I show cross-sectional views of an example method for manufacturing an example semiconductor device.

FIGS. 9A to 9H show cross-sectional views of an example method for manufacturing an example semiconductor device.

FIGS. 11A to 11F show cross-sectional views of an example method for manufacturing an example semiconductor device.

Figure 1:
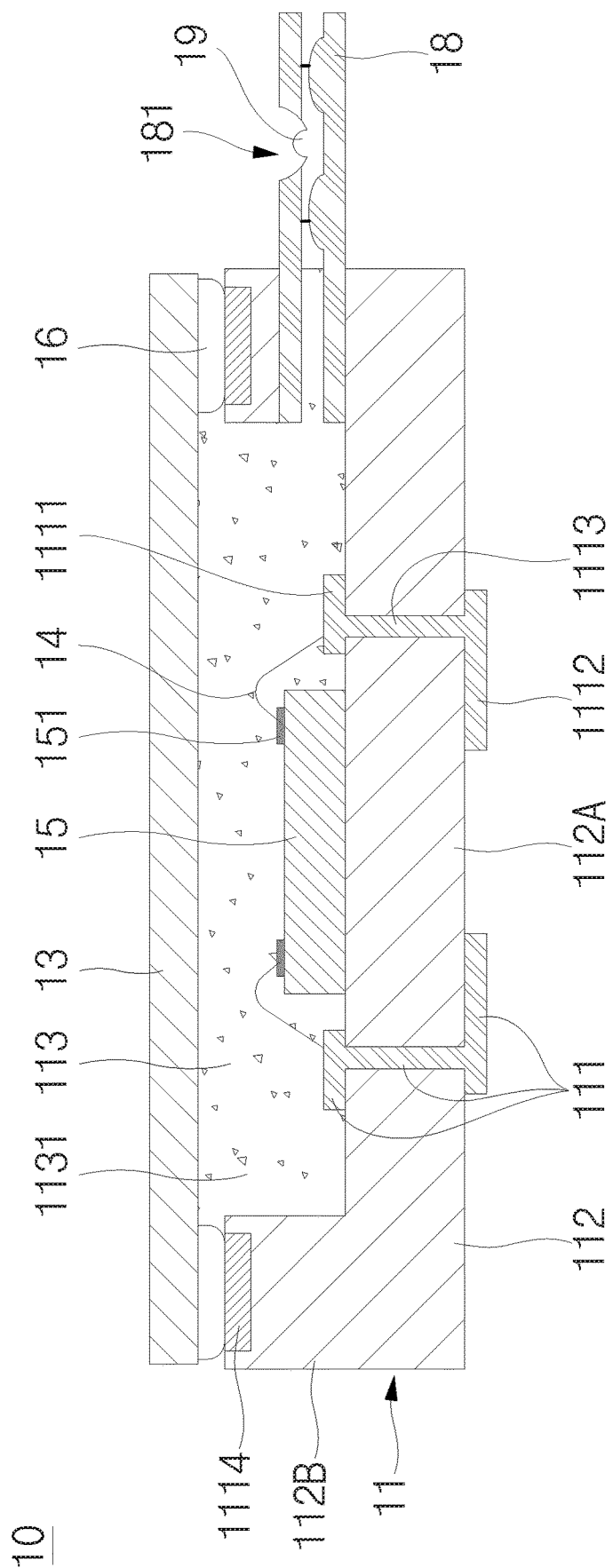
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}. The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure. Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a cavity substrate comprising a base and a sidewall to define a cavity, an electronic component on a top side of the base in the cavity, a lid over the cavity and over the sidewall, and a valve to provide access to the cavity, wherein the valve has a plug to provide a seal between a cavity environment and an exterior environment outside the cavity.

In another example, a method to manufacture a semiconductor device comprises providing a cavity substrate comprising a base and a sidewall to define a cavity, providing an electronic component on a top side of the base in the cavity, providing a lid over the cavity contacting the sidewall, and providing a valve to provide access to the cavity, wherein the valve has a plug to provide a seal between a cavity environment and an environment outside the cavity.

In a further example, a semiconductor device comprises a substrate comprising a base and a sidewall extending vertically from the base, a lid over the sidewall to define a cavity between the base, the sidewall, and the lid, an electronic component in the cavity, a valve between the cavity and an exterior environment outside the cavity, a seal between the lid and the sidewall, and a plug in the valve, wherein the seal and the plug hermetically seal the cavity from the exterior environment.

Other examples are included in the present disclosure. Such examples may be found in the figures, in the claims, or in the description of the present disclosure.

FIG. 1 shows a cross-sectional view of an example semiconductor device 10. In the example shown in FIG. 1, semiconductor device 10 can comprise cavity substrate 11, electronic component 15, interconnect 14, lid 13, seal 16, valve 18, and plug 19.

Cavity substrate 11 can comprise conductive structure 111 and dielectric structure 112. Conductive structure 111 can comprise substrate internal terminal 1111, substrate external terminal 1112, conductive path 1113 and seal base 1114 (optional). Conductive structure 111 can be in base 112A and can be electrically coupled with electronic component 15. Dielectric structure 112 can comprise base 112A and sidewall 112B. Cavity 113 can be defined by base 112A and sidewall 112B. Cavity environment or volume 1131 can be implemented in cavity 113. Electronic component 15 can comprise component terminal 151. Valve 18 can comprise tap 181. In some examples, cavity substrate 11 can comprise base 112A and sidewall 112B to define cavity 113.

In some examples, lid 13 can be over cavity 113 and sidewall 112B of cavity substrate 11. Cavity substrate 11, lid 13, seal 16, valve 18, and plug 19 can be referred to as a hermetic semiconductor package and can provide protection for electronic component 15 from external elements or environmental exposure. Valve 18 can provide access to cavity 113 and plug 19 can provide a seal in valve 18 between the cavity environment and an exterior environment outside cavity 113. Semiconductor package can provide electrical coupling between external electrical components and substrate external terminal 1112. In some examples, electronic component 15 can be on a top side of base 112A. Electronic component 15 can include electronic elements or optical elements as an example, and the scope of the disclosed subject matter is not limited in this respect.

Figure 2C:
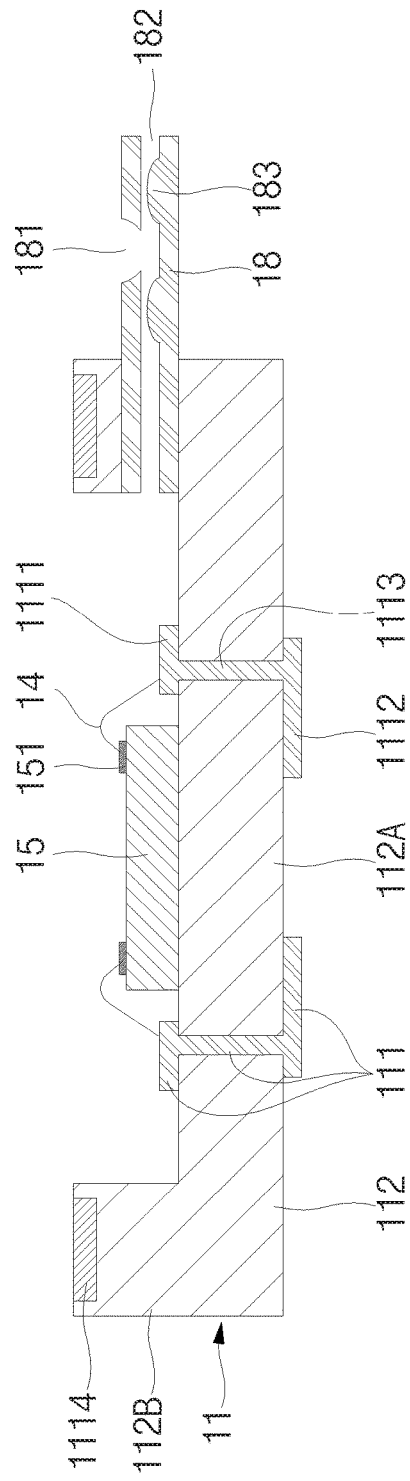

FIGS. 2A to 2H show cross-sectional views of an example method for manufacturing semiconductor device 10. FIG. 2A shows a cross-sectional view of semiconductor device 10 at an early stage of manufacture.

In the example shown in FIG. 2A, cavity substrate 11 can be provided wherein cavity substrate can comprise base 112A and sidewall 1114. Cavity substrate 11 can have a thickness in the range from about 100 micrometers (μm) to about 1500 μm. As described above, cavity substrate 11 can comprise conductive structure 111 and dielectric structure 112.

Conductive structure 111 can comprise several elements such as substrate internal terminal 1111, substrate external terminal 1112, conductive path 1113, or seal base 1114. Substrate internal terminal 1111 can be located at a top of base 112a of dielectric structure 112 and within cavity 113 of dielectric structure 112. Substrate external terminal 1112 can be located at a bottom of base 112A of dielectric structure 112. Conductive path 1113 can traverse through dielectric structure 112 to couple substrate internal terminal 1111 with substrate external terminal 1112. In some examples, seal base 1114 can be provided along the periphery of dielectric structure 112 at the top of sidewall 112B. In some examples, seal base 1114 can be in sidewall 112B with seal 16 between seal base 1114 and lid 13. Conductive structure 111 or its elements can comprise or can be referred to as one or more conductive layers, traces, pads, vias, or leads. Substrate internal terminal 1111 can comprise or can be referred to as pads or traces. Substrate external terminal 1112 can also comprise or can be referred to as pads or traces. Conductive path 1113 can comprise or can be referred to as one or more vias or traces. Seal base 1114 can comprise or can be referred to as conductive pads or conductive lands. In some examples, substrate internal terminal 1111, substrate external terminal 1112, conductive path 1113, or seal base 1114 can comprise copper, aluminum, nickel, gold, or silver. In some examples, seal base 1114 can comprise copper, tungsten, or a nickel-gold plating. Elements of conductive structure 111, such as substrate internal terminal 1111, substrate external terminal 1112, conductive path 1113, or seal base 1114, can have a thickness in the range from about 10 μm to about 50 μm.

Dielectric structure 112 can comprise base 112A and sidewall 112B. Base 112A can have a substantially planar top side and a substantially planar bottom side opposite to the top side. Sidewall 112B can upwardly extend or protrude along the periphery of base 112A. A vertical thickness of base 112A can be greater than a horizontal thickness of sidewall 112B. In some examples, when planarly viewed, sidewall 112B can be substantially rectangular. Conductive structure 111 can be accessible at the top and bottom sides of base 112A. In some examples, substrate internal terminal 1111 can be provided on the top side of base 112A, substrate external terminal 1112 can be provided on the bottom side of base 112A, and conductive path 1113 can pass through base 112A. Seal base 1114 can be provided on the top side of sidewall 112B. As an example, seal base 1114 can be embedded on sidewall 112B so that the top side of seal base 1114 is substantially coplanar with the top side of sidewall 112B.

Dielectric structure 112 can comprise one or more dielectric layers stacked on each other, such as ceramic layers, molded resin layers, or laminate layers. Dielectric structure 112 can have a thickness in the range from about 100 μm to about 1500 μm. Cavity 113 defined by base 112A and sidewall 112B can have a depth in the range from about 100 μm to about 1000 μm.

In examples where dielectric structure 112 comprises ceramic, dielectric structure 112 can comprise or can be referred to as alumina, silicon nitride, sapphire, or borosilicate glass. In some examples, cavity substrate 11 can be manufactured in a similar manner to that of a low temperature co-fired ceramic (LTCC) substrate. In some examples, the LTCC substrate can generally be co-fired at a low temperature of about 1000° C. or less. The LTCC technology can comprise forming via holes in dielectric sheet having a thickness in the range from about 40 μm to 80 μm and filling the via holes with a conductor or conductive paste to provide conductive path 1113, printing conductor patterns to provide substrate internal terminal 1111, substrate external terminal 1112, or seal base 1114, coupling valve 18, laminating, and co-firing. In some examples, an operation for forming seal base 1114 using sputtering and plating can be separately performed. In some examples, an operation for coupling valve 18 to sidewall 112B of substrate 11 can be performed.

In some examples, "green sheets" or layers of ceramic and binding agent can be prepared prior to low temperature co-firing. Via holes having an appropriate size can be formed in the green sheets using a punching tool or laser beams, and conductor paste can fill the via holes. The conductor paste filling the via holes can become conductive path 1113. Then, conductor patterns can be printed. During the conductor pattern printing process, the conductor material can be provided as a desired circuit pattern, for example using printing. As the result of this process, substrate internal terminal 1111, substrate external terminal 1112, or seal base 1114 can be provided. Valve 18 can be fixedly inserted into sidewall of one or more green sheets. The respective green sheets can be stacked and adhered to one another by applying heat and pressure. In the co-firing process, binder components can be eliminated or vaporized from the stacks at a temperature ranging from about 300° C. to about 400° C.

In some examples, cavity substrate 11 can be formed as a molded resin substrate with dielectric structure 112 having one or more layers of molded material. In some examples, cavity substrate 11 can be a pre-formed or laminate substrate having one or more laminate layers as dielectric structure 112. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or lasers. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process.

Valve 18 can be coupled through sidewall 112B of dielectric structure 112. Valve 18 can be coupled through sidewall 112B of cavity substrate 11 to cavity 113. In some examples, an inner end of valve 18 can be coplanar with the inner side of sidewall 112B. In some examples, the inner end of valve 18 can protrude from the inner side of sidewall 112B into cavity 113. In some examples, the outer end of valve 18 can outwardly protrude from the outer side of sidewall 112B. Valve 18 can comprise a passage 182 that can allow air to be discharged from cavity 113, or can allow gas, such as inert gas or air, to be introduced into cavity 113 to a target pressure. Valve 18 can comprise or can be referred to as a pipe, a tube, or a passageway. Valve 18 can comprise an orifice or tap 181 leading to passage 182. Tap 181 can be provided on a region of valve 18 positioned at the exterior side of sidewall 112B. Valve 18 can comprise kovar, steel, stainless steel, copper, aluminum, or nickel. In some examples, valve 18 can comprise a similar material to that of a lead frame. In some examples, valve 18 can comprise dam 183 formed at a region of passage 182 corresponding to tap 181. Plug may be positioned in dam 183. In some examples, dam 183 can comprise a dam perimeter configured to restrain plug 19 from lateral displacement or expansion. A thickness or height of dam 183 can be smaller than a thickness or height of passage 182 of valve 18. Each of dams 183 can have a thickness in the range from about 10 µm to about 100 µm. Valve 18 can have a diameter in the range from about 50 µm to about 200 µm.

The completed cavity substrate 11 can comprise cavity 113 and valve 18 providing access to cavity 113 through sidewall 112B of substrate 11. In some examples, where dielectric structure 112 of cavity substrate 11 includes ceramic as a major material, high thermal conductivity and chemical stability as well as enhanced high frequency performance and electrical performance can be achieved.

FIG. 2B shows a cross-sectional view of semiconductor device 10 at a later stage of manufacture. In the example shown in FIG. 2B, electronic component 15 can be provided on cavity substrate 11. In some examples, electronic component 15 can be provided or attached on top side of base 112A of cavity substrate 11 using an adhesive or thermal interface material. Electronic component 15 can comprise component terminal 151 at its top side. Electronic component 15 can comprise or can be referred to as a die, a chip, or a package, where the die or the chip can comprise an integrated circuit separated from a semiconductor wafer. The package can be completed by covering the die or the chip using a protective material. Electronic component 15 can comprise, for example, digital signal processors (DSPs), microprocessors, network processors, power management units, audio processors, radio-frequency (RF) circuits, wireless baseband system-on-chip (SoC) processors, sensors, or application specific integrated circuits (ASICs). Electronic component 15 can have a thickness in the range from about 100 µm to about 775 µm. Electronic component 15 can be positioned within cavity 113 of cavity substrate 11 to be protected from external environment or to be provided with a desired operational environment.

FIG. 2C shows a cross-sectional view of semiconductor device 10 at a later stage of manufacture. In the example shown in FIG. 2C, interconnect 14 can be coupled between electronic component 15 and cavity substrate 11. One end of interconnect 14 can be electrically connected to component terminal 151 of electronic component 15, and the other end of interconnect 14 can be electrically connected to substrate internal terminal 1111 of cavity substrate 11. Interconnect 14 can comprise or can be referred to as a wire or a bump. Interconnect 14 can comprise or can be referred to as gold, copper, aluminum, or solder. In some examples, if component interconnect 151 of electronic component 15 faces upward, interconnect 14 can comprise, for example, a wire and can electrically connect electronic component 15 and cavity substrate 11. For example, one end of interconnect 14 can be firstly ball-bonded to component terminal 151, and the other end of interconnect 14 can be secondly stitch-bonded to substrate internal terminal 1111, or vice versa. In some examples, if component interconnect 151 of electronic component 15 faces downward, interconnect 14 can comprise, for example, a bump and can electrically connect electronic component 15 and cavity substrate 11. For example, ball-type or pillar-type interconnect 14 can be attached to component terminal 151 or substrate internal terminal 1111 and electronic component 15 can then be attached onto cavity substrate 11 through a mass reflow process, a thermal compression process or a laser assist bonding process. Interconnect 14 can have a diameter in the range from about 15 µm to about 50 µm.

Figure 2D:
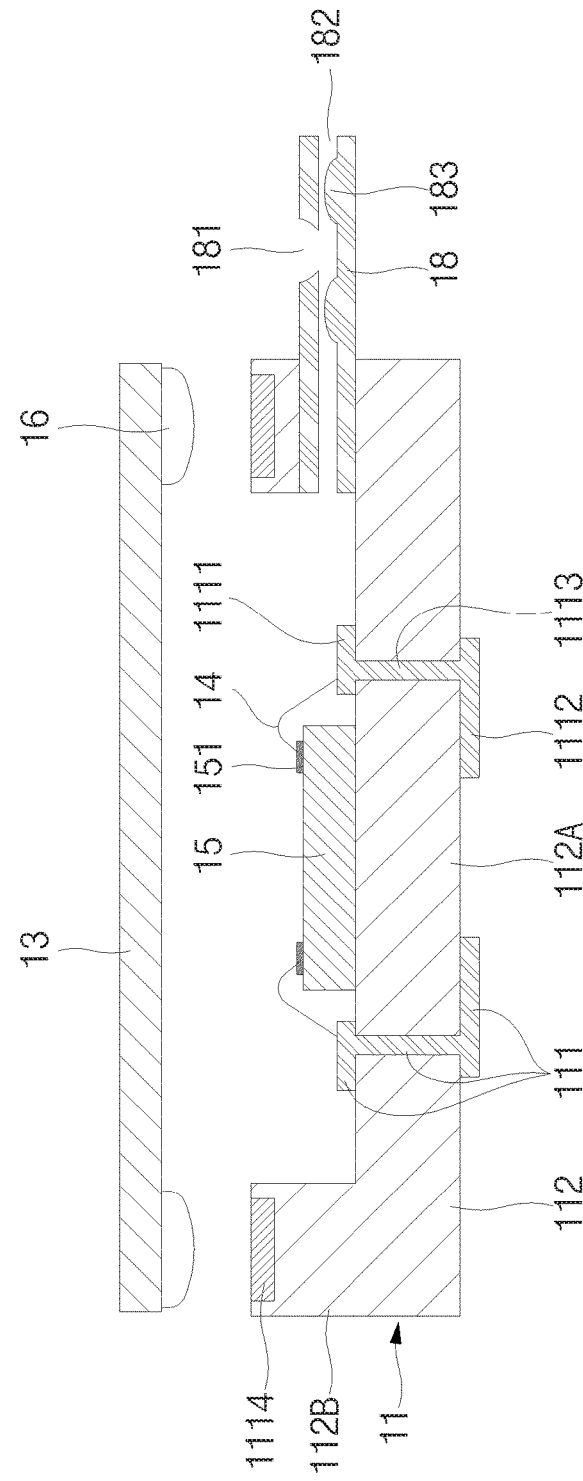

FIGS. 2D and 2E show a cross-sectional view of semiconductor device 10 at a later stage of manufacture. In the example shown in FIGS. 2D and 2E, lid 13 can be provided on cavity substrate 11. Lid 13 can have a planar top side and a planar bottom side. The bottom side of lid 13 can be attached onto sidewall 112B of cavity substrate 11. The bottom side of lid 13 can be attached onto seal base 1114 provided on sidewall 112B. Lid 13 can comprise or can be referred to as a cover or a cap. Lid 13 can comprise or can be referred to as a metal, plastic resin, or ceramic. Lid 13 can have a thickness in the range from about 100 µm to about 500 µm. Lid 13 can be attached to sidewall 112B of cavity substrate 11 using seal 16. Seal 16 can be provided on a region of lid 13 corresponding to seal base 1114 located on sidewall 112B. Seal 16 can comprise or can be referred to as a solder or an adhesive. In some examples seal 16 can be provided on one of lid 13 or seal base 1114 and can then be bonded to another one of lid 13 or seal base 1114 through a mass reflow process, a thermal compression process, or a laser assist bonding process. Seal 16 can have a thickness in the range from about 10 µm to about 100 µm. Lid 13 and seal 16 can cover cavity 113 of cavity substrate 11 to provide protection of electronic component 15 and interconnect 14 from external environment or maintaining a desired environment 1113 within cavity 113.

FIG. 2F shows a cross-sectional view of semiconductor device 10 at a later stage of manufacture. In the example shown in FIG. 2F, plug 19 can be provided in valve 18. Plug 19 can be mounted on tap 181 of valve 18 to occlude tap 181. Plug 19 can comprise or can be referred to as a microball, a solder, a resin, or an adhesive. In some examples, plug 19 can comprise a lead (Pb) free solder alloy such as a Sn—Ag—Cu alloy, or AuSn solder. A diameter of plug 19 can be slightly larger than that of tap 181. Plug 19 can have a diameter in the range from about 10 µm to about 150 µm. In this way, tap 181 of valve 18 can be temporarily occluded, passage 182 of valve 18 can be still opened.

FIG. 2G shows a cross-sectional view of semiconductor device 10 at a later stage of manufacture. In the example shown in FIG. 2G, the air in cavity 113 can be discharged to the exterior side through valve 18 to generate a vacuum in cavity 113. In the same or other examples, a desired gas such as an inert gas or air can be introduced to a target pressure into cavity 113 through valve 18. In some examples, the cavity environment can comprise a vacuum or an inert gas. In some examples, vacuum equipment can be connected to valve 18 to release the air in cavity 113 out of cavity, and gas filling equipment can be connected to valve 18 to allow gas to fill cavity 113. Examples of inert gas can comprise nitrogen, argon, or helium. The internal gas pressure of cavity 113 can be in the range from about 0 millibars (mbar) to about 1100 mbar. Cavity environment 1131 can be provided in which cavity 113 is left as vacuum or is filled with gas.

FIG. 2H shows a cross-sectional view of semiconductor device 10 at a later stage of manufacture. In the example shown in FIG. 2H, tap 181 and passage 182 of valve 18 can be occluded by plug 19. In some examples, tap 181 and passage 182 can be occluded by melting plug 19 using, for instance, a laser beam to seal plug 19 in valve 18. Melted plug 19 can be positioned or can flow between a pair of dams to then be cured, and cured plug 19 can plug passage 182 and tap 181. Cavity environment 1131 provided in cavity 113 can be isolated from an external environment by cured plug 19. In some examples, laser beam sources can comprise a carbon dioxide (CO2) laser, a fiber laser, or an yttrium aluminum garnet (YAG) laser, and lasers can be oscillated in a pulsed laser mode or a continuous wave mode. In some ex µm maples, the laser output power can be in the range from about 200 watts (W) to about 20 kilowatts (kW).

Figure 3:
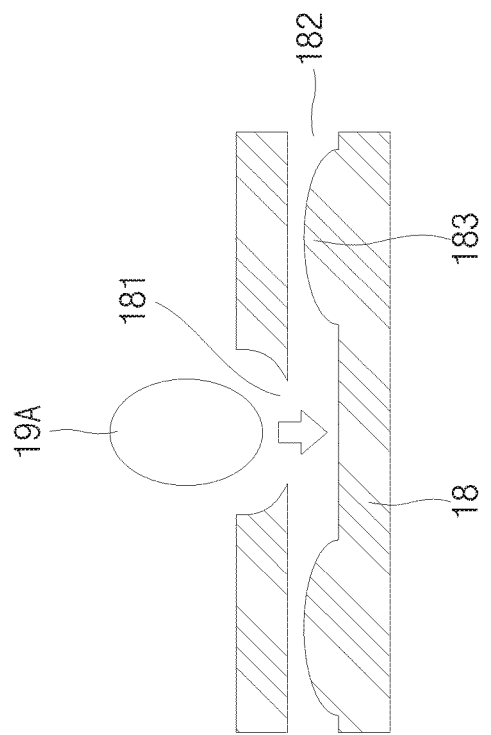
FIG. 3 shows cross-sectional views of an example method for manufacturing an example semiconductor device.

FIG. 3 shows cross-sectional views of an example method for manufacturing an example semiconductor device. In the example shown in FIG. 3, in order to occlude tap 181 and passage 182 of valve 18, a forced inserting process or a bolting process can be employed instead of a laser beam process. Air in cavity 113 can be removed from cavity 113 through valve 18, or gas can be introduced into cavity 113 through valve 18 to a target pressure, and then plug 19 or 19A can be forcedly inserted into or bolted into tap 181 and passage 182, thereby occluding tap 181 and passage 182 of valve 18. In this manner, a vacuum can be provided in the cavity environment, or an inert gas can be provided in the cavity environment, and the cavity environment can be maintained by sealing plug 19 or 19A into valve 18. In some examples, plug 19 or 19A can comprise or can be referred to as a soft metal ball, a soft plastic resin ball, or a soft metal ball enclosed with a soft plastic resin. If plug 19 or 19A, which is made of a soft material, is forcedly inserted into tap 181, the shape of plug 19 or 19A is changed so that tap 181 and passage 182 can be occluded by plug 19 or 19A. In some examples, the soft material can comprise or can be referred to as a solder, aluminum, gold, or silver, and the soft plastic resin can comprise or can be referred to as polyimide (PI), polypropylene (PP), polyethylene (PE), or a Teflon resin.

Figure 4:
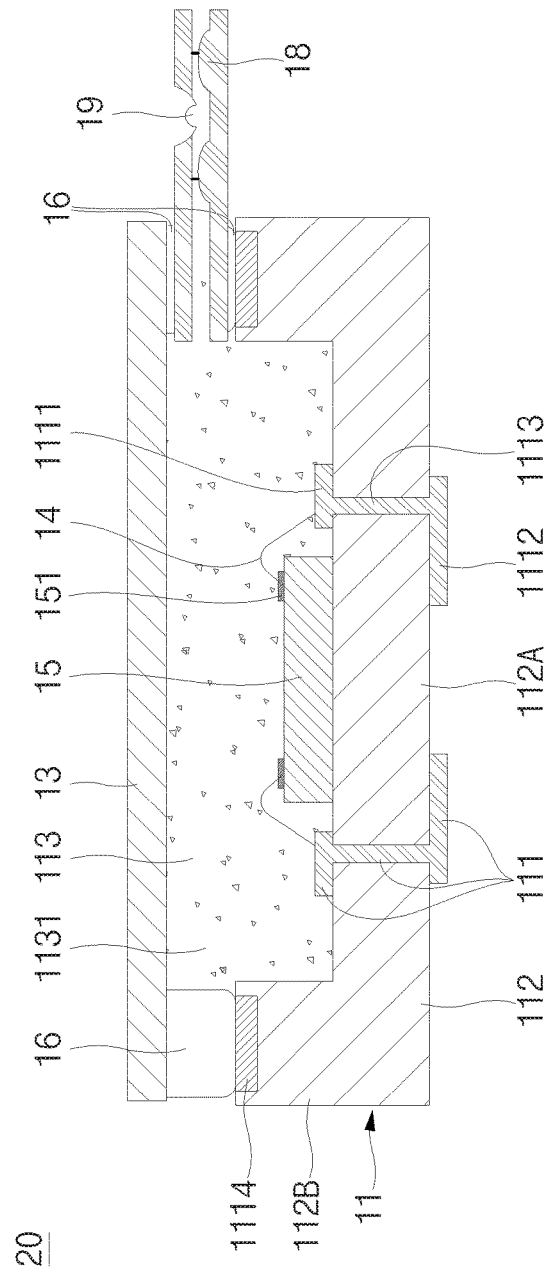
FIG. 4 shows a cross-sectional view of an example semiconductor device.

FIG. 4 shows a cross-sectional view of an example semiconductor device 20. Semiconductor device 20 shown in FIG. 4 can be similar to example semiconductor device 10 shown in FIG. 1, and valve 18 is provided between cavity substrate 11 and lid 13. In the example shown in FIG. 4, semiconductor device 20 can be configured such that valve 18 is positioned between sidewall 112b of cavity substrate 11 and lid 13, rather than being positioned at sidewall 112B of cavity substrate 11. Valve 18 can be fixed between sidewall 112B of cavity substrate 11 and lid 13 by seal 16.

FIGS. 5A to 5I show cross-sectional views of an example method for manufacturing an example semiconductor device 20. The manufacturing method of example semiconductor device 20 shown in FIGS. 5A to 5I can be similar to corresponding operations or figures described in FIGS. 2A to 2H, for example for semiconductor device 10. FIGS. 5A to 5I, however, show valve 18 positioned between cavity substrate 11 and lid 13. The following description will focus on differences between the methods.

Figure 5A:
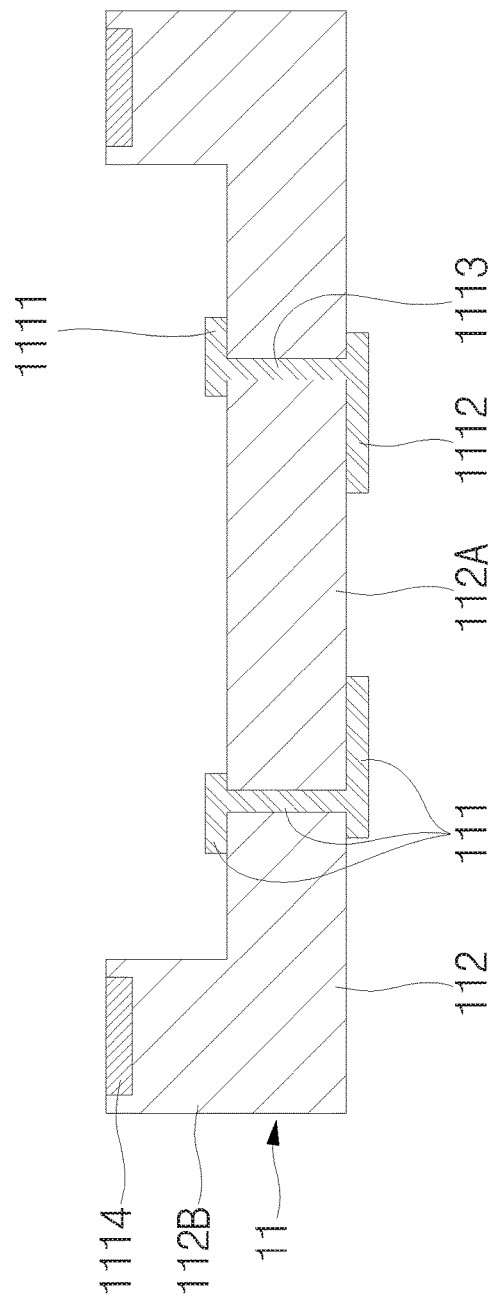
FIGS. 5A to 5I show cross-sectional views of an example method for manufacturing an example semiconductor device.

FIG. 5A shows a cross-sectional view of semiconductor device 20 at an early stage of manufacture. In the example shown in FIG. 5A, cavity substrate 11 can be provided without valve 18 attached. Cavity substrate 11 can comprise conductive structure 111 and dielectric structure 112. Sidewall 112B of dielectric structure 112 can lack the passageway to which valve 18 was attached in the example of FIGS. 1-2.

Figure 5B:
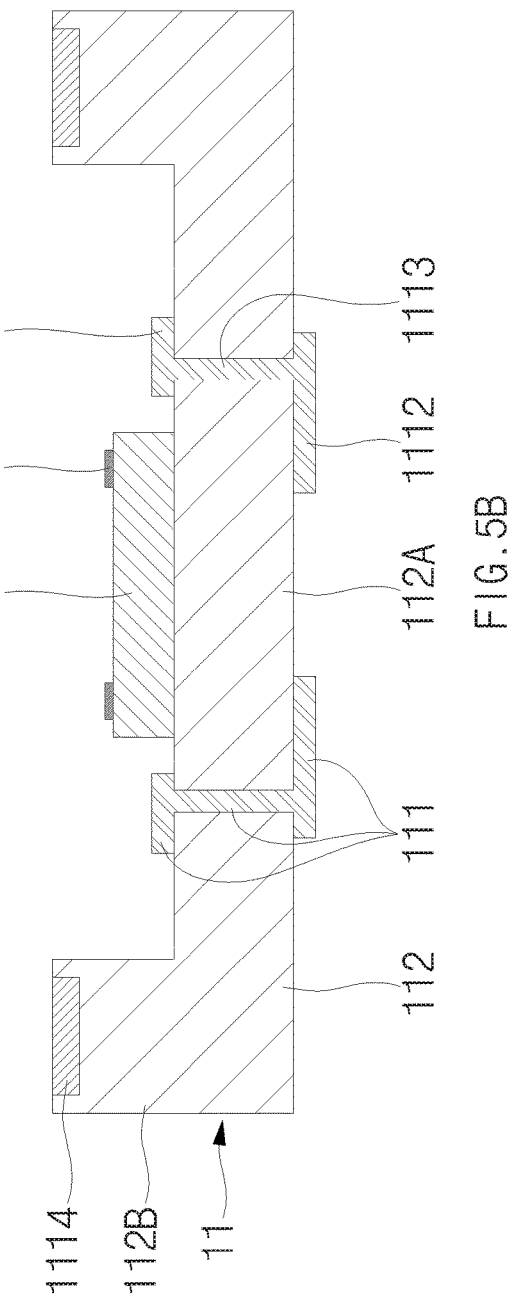

FIG. 5B shows a cross-sectional view of semiconductor device 20 at a later stage of manufacture. In the example shown in FIG. 5B, electronic component 15 can be provided on cavity substrate 11. In some examples, electronic component 15 can be attached onto base 112A of cavity substrate 11 using an adhesive or a thermally conductive material.

Figure 5C:
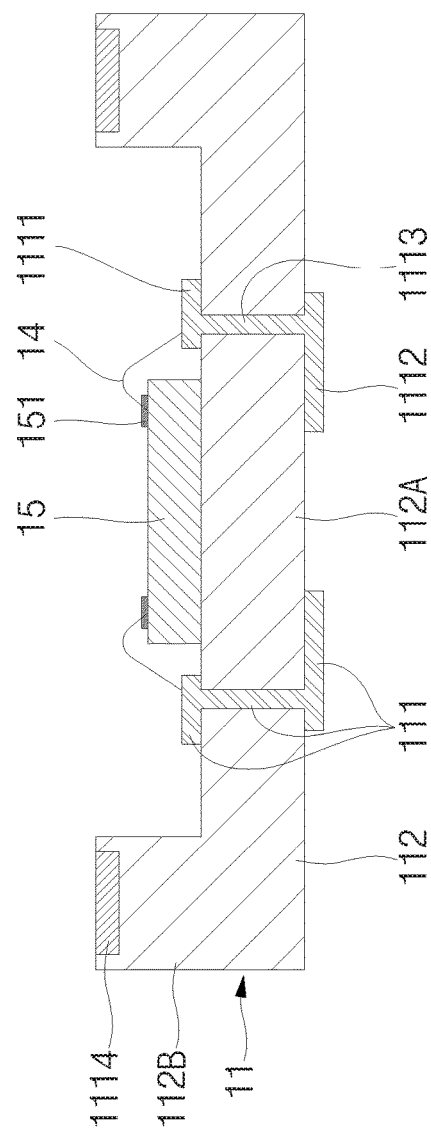

FIG. 5C shows a cross-sectional view of semiconductor device 20 at a later stage of manufacture. In the example shown in FIG. 5C, interconnect 14 can be provided between electronic component 15 and cavity substrate 11.

Figure 5D:
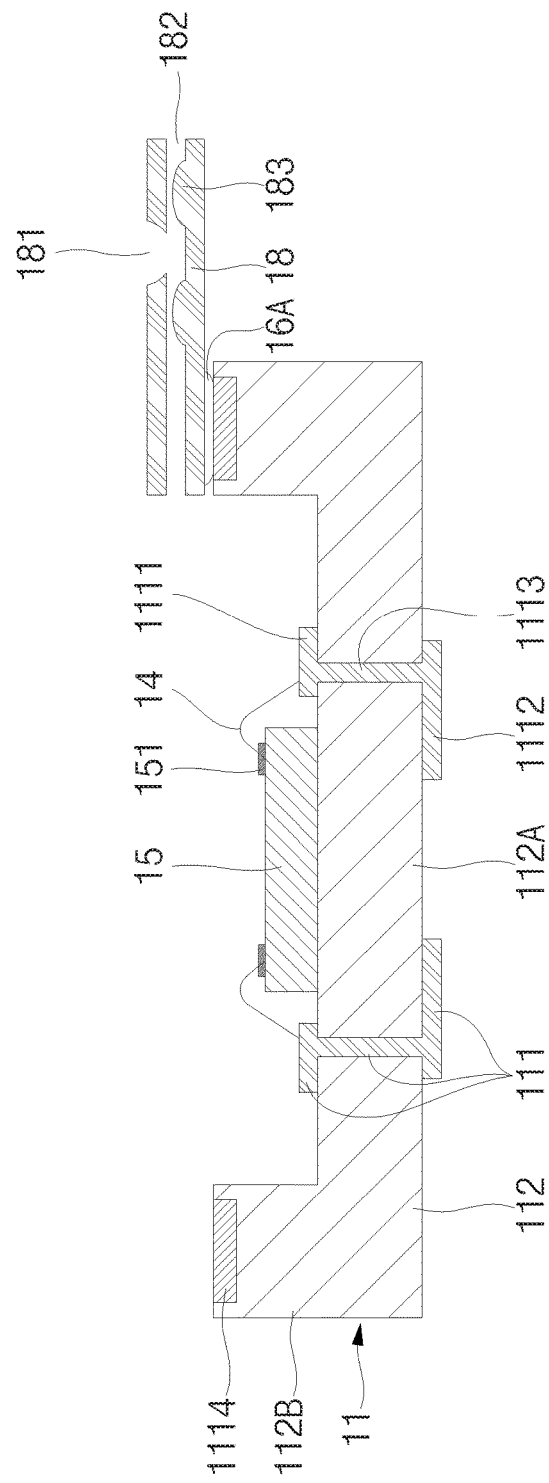

FIG. 5D shows a cross-sectional view of semiconductor device 20 at a later stage of manufacture. In the example shown in FIG. 5D, valve 18 can be provided. In some examples, valve 18 can be provided on or attached to cavity substrate 11 on the top of sidewall 112B or on seal base 1114. In some examples, valve 18 can be coupled to seal base 1114 by seal 16A, which can comprise or can be referred to as a solder or an adhesive. In some examples, an inner end of valve 18 can be substantially coplanar with the inner side of sidewall 112B, or an outer end of valve 18 can protrude past the outer side of sidewall 112B. Valve 18 can comprise a passage 182 that can allow air to be discharged to the exterior from cavity 113, or can allow a gas, such as an inert gas, to be injected into cavity 113 from the exterior of cavity 113. Valve 18 can comprise tap 181 or orifice connected to passage 182. Tap 181 can be provided on a region of valve 18 positioned at the exterior side of sidewall 112B.

Figure 5E:
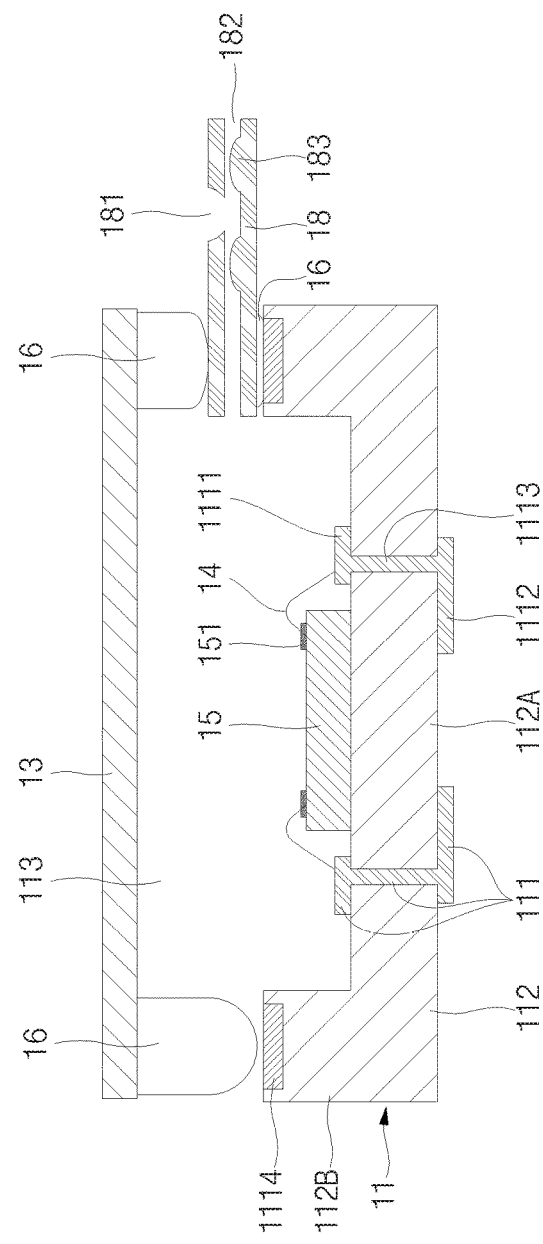
Figure 5F:
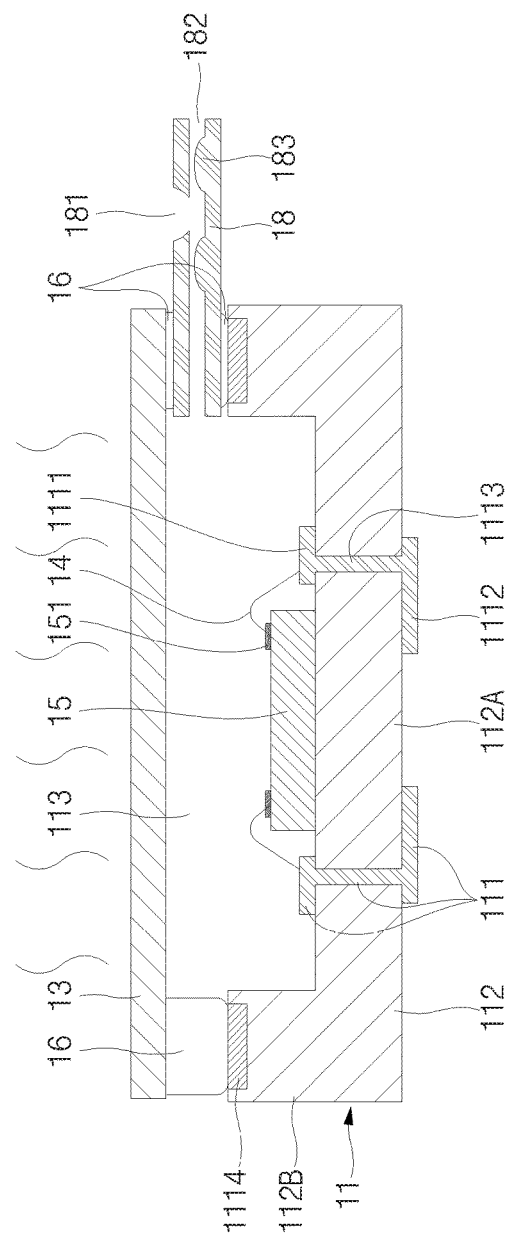

FIGS. 5E and 5F show a cross-sectional view of semiconductor device 20 at a later stage of manufacture. In the example shown in FIGS. 5E and 5F, lid 13 can be provided on cavity substrate 11 and valve 18. A bottom side of lid 13 can be attached to sidewall 112B and valve 18 of cavity substrate 11. The bottom side of lid 13 can be attached onto seal base 1114 provided on sidewall 112B or onto valve 18. Lid 13 can be attached to sidewall 112B of cavity substrate 11 or to valve 18 by seal 16. Seal 16 can be provided on a region of lid 13 corresponding to seal base 1114 located on sidewall 112B and a region of lid 13 corresponding to valve 18, respectively. In some examples, after seal 16 is adhered to lid 13 or to seal base 1114 and valve 18, lid 13 can be bonded onto seal base 1114, sidewall 112B, or valve 18 through a mass reflow process, a thermal compression process, or a laser assist bonding process. In some examples, seal 16 adhered to lid 13 can be integral with or coupled to seal 16A adhered between valve 18 and sidewall 112B. Because valve 18 is positioned between lid 13 and cavity substrate 11, a thickness of seal 16 can be larger than that of valve 18.

Figure 5G:
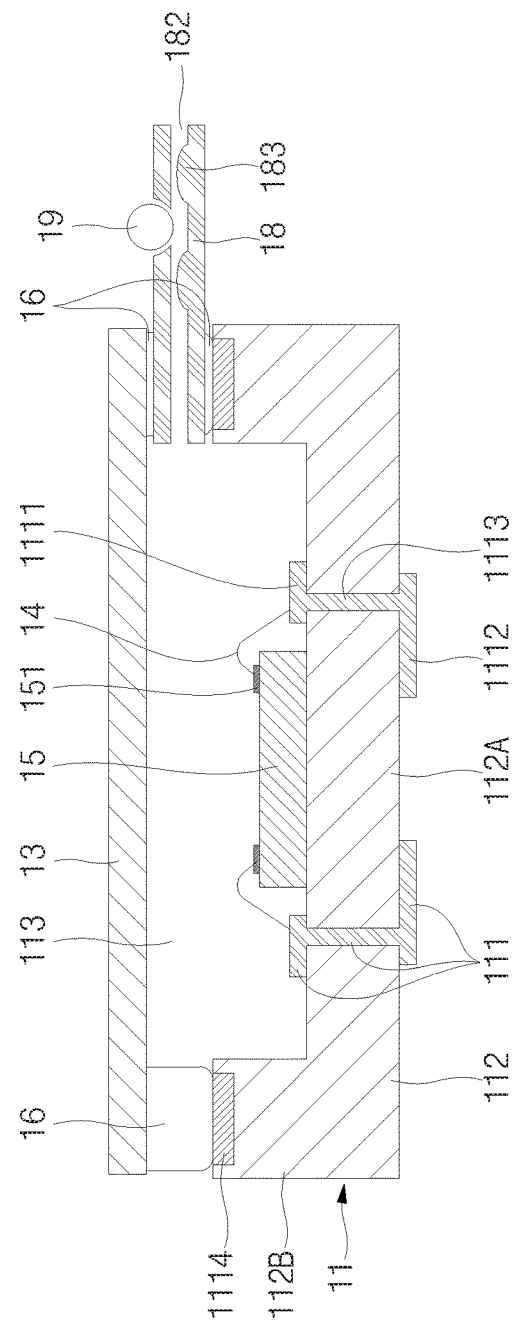

FIG. 5G shows a cross-sectional view of semiconductor device 20 at a later stage of manufacture. In the example shown in FIG. 5G, plug 19 can be provided in valve 18. Plug 19 can be mounted on tap 181 of valve 18 to temporarily occlude tap 181.

Figure 5H:
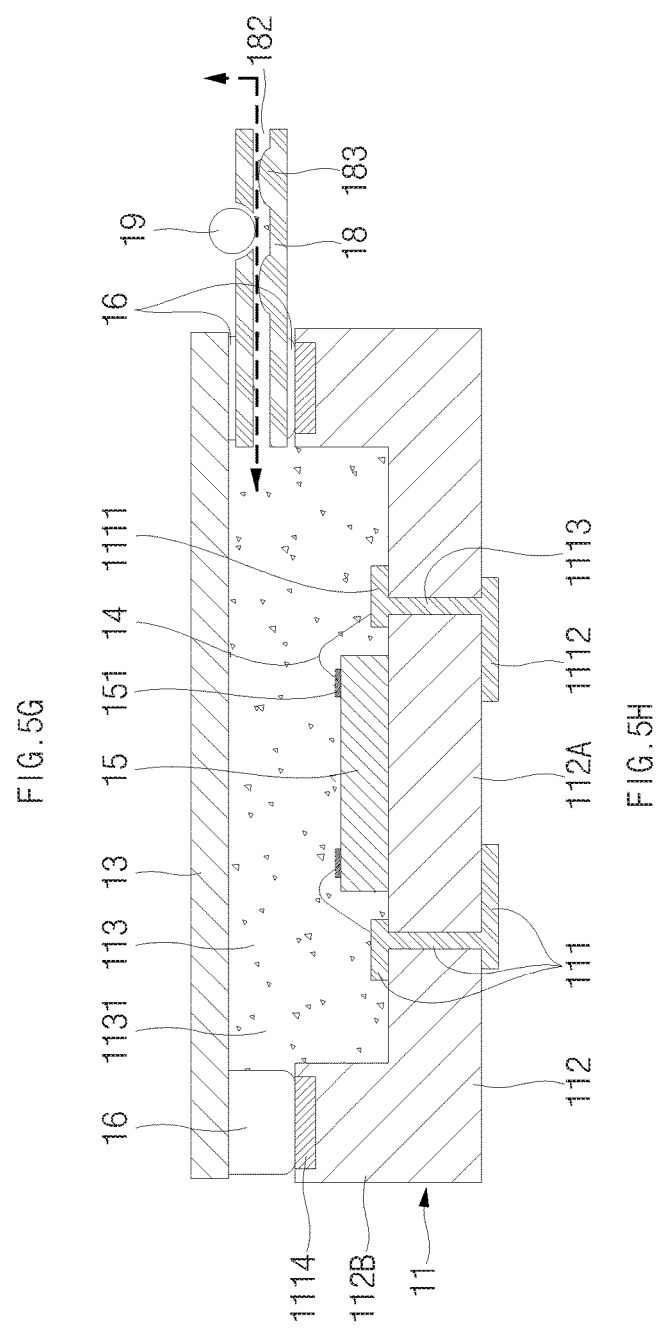

FIG. 5H shows a cross-sectional view of semiconductor device 20 at a later stage of manufacture. In the example shown in FIG. 5H, air in cavity 113 can be discharged to the exterior side through valve 18, or a gas such as inert gas or air can be introduced to cavity 113 through valve 18.

Figure 5I:
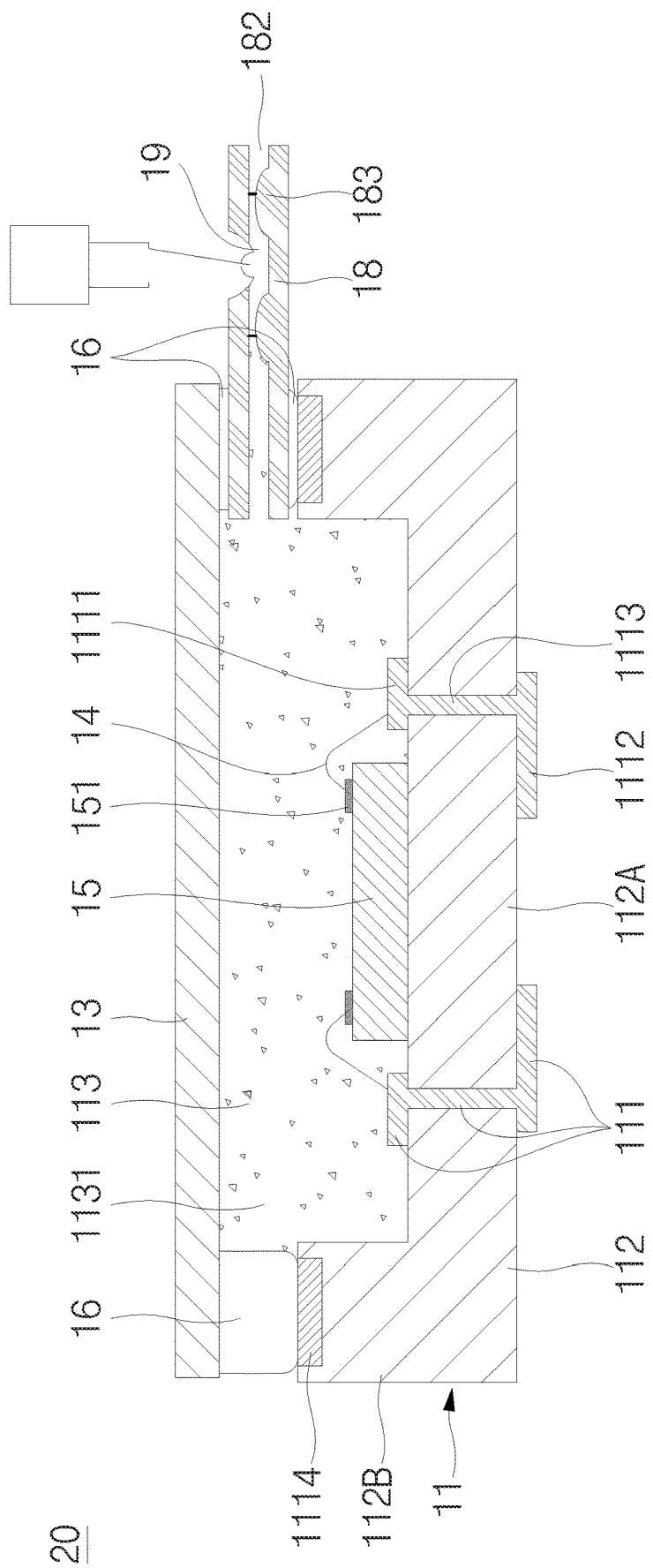

FIG. 5I shows a cross-sectional view of semiconductor device 20 at a later stage of manufacture. In the example shown in FIG. 5I, tap 181 and passage 182 of valve 18 can be occluded by plug 19. In some examples, tap 181 and passage 182 can be occluded by melting plug 19 using, for instance, a laser beam, or by performing a forced inserting or bolting process.

Figure 6:
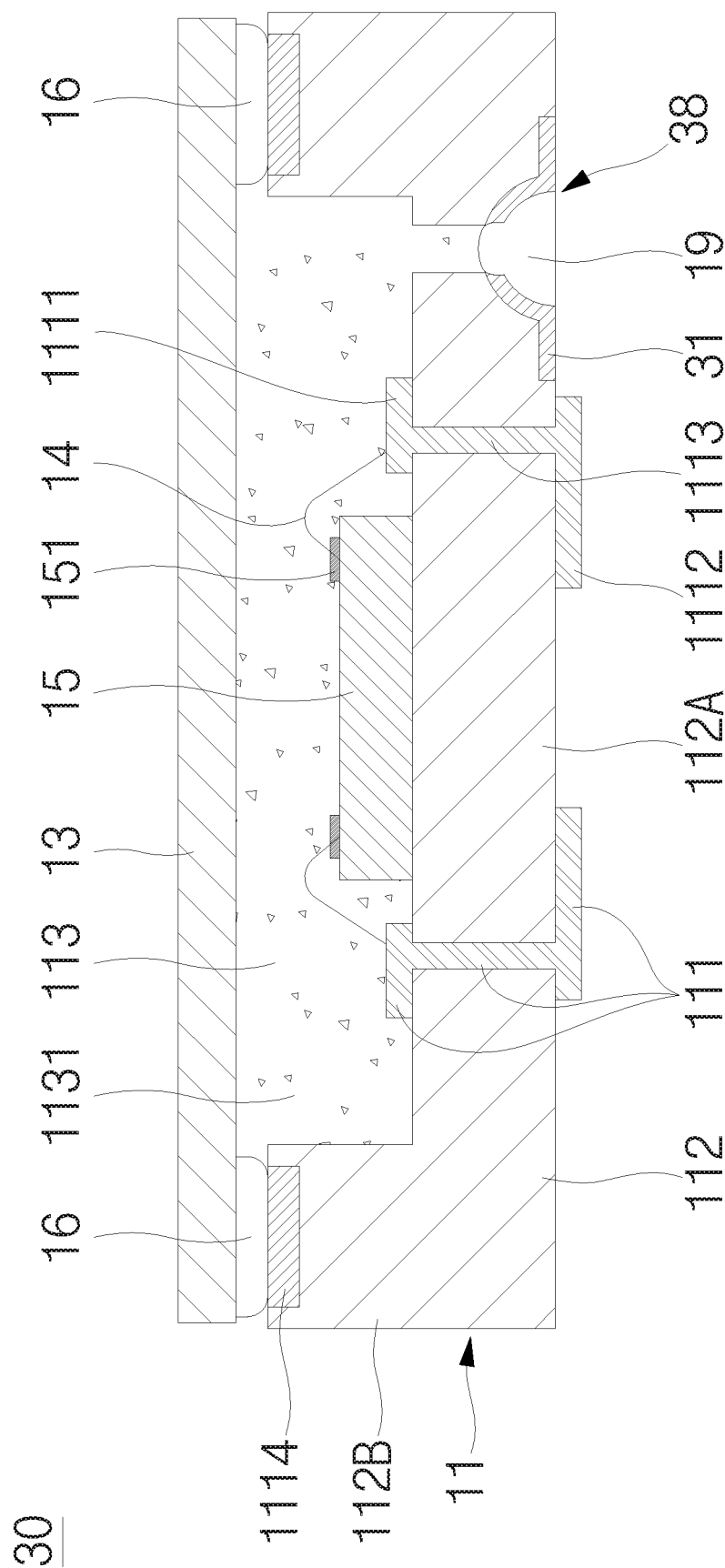
FIG. 6 shows a cross-sectional view of an example semiconductor device.

FIG. 6 shows a cross-sectional view of an example semiconductor device 30. Example semiconductor device 30 shown in FIG. 6 can be similar to example semiconductor device 10 shown in FIG. 1, and valve 38 can be incorporated in cavity substrate 11. In the example shown in FIG. 6, semiconductor device 30 can be configured such that valve 38 comprises an aperture provided at or in base 112A of cavity substrate 11, rather than being positioned at sidewall 112B of cavity substrate 11. Base 112A of cavity substrate 11 can comprise valve 38 and valve base 31. Semiconductor device 30 can comprise plug 19 positioned in valve 38.

FIGS. 7A to 7I show cross-sectional views of an example method for manufacturing an example semiconductor device 30. The manufacturing method of example semiconductor device 30 shown in FIGS. 7A to 7I can be similar to corresponding operations or figures described in FIGS. 2A to 2H, for example for semiconductor device 10. FIGS. 7A to 7I, however, show valve 38 positioned at base 112A of cavity substrate 11. The following description will focus on differences between both methods.

Figure 7A:
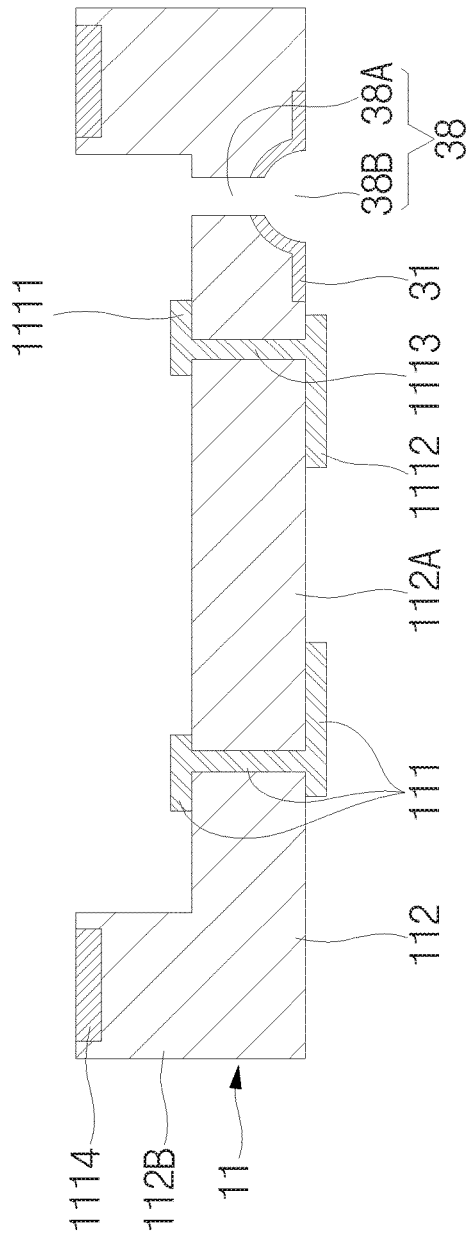

FIG. 7A shows a cross-sectional view of semiconductor device 30 at an early stage of manufacture. In the example shown in FIG. 7A, cavity substrate 11 can be provided. Cavity substrate 11 can comprise base 112A and sidewall 112B. Base 112A can have a substantially planar top side and a substantially planar bottom side opposite to the top side. Valve 38 can be provided to vertically pass through the top and bottom of base 112A. In some examples, valve 38 can be provided through a chemical etching process, a laser beam process, or a mechanical drilling process.

In some examples, valve 38 can comprise a first, upper through-hole 38A and a second, lower through-hole 38B connected to each other. Upper through-hole 38A connected to the top side of base 112A can have a constant width, and lower through-hole 38B connected to the bottom side of base 112A can have a gradually increasing width toward the bottom side of base 112A. A width of the second, lower through-hole 38B at the bottom side of valve 38 can be greater than a width of the first, upper through-hole 38A. Plug 19 can be in the second, lower through-hole 38B to seal cavity 13. In some examples, lower through-hole 38B can be substantially semi-circular or bowl-shaped around the bottom side of base 112A. In some examples, lower through-hole 38B of valve 38 can comprise or be referred to as a dam or dam perimeter configured to restrain plug 19 from lateral displacement or expansion. Valve 38 can have a width in the range from about 50 μm to about 200 μm. The width of lower through-hole 38B can be greater than the width of upper through-hole 38A. In some examples, valve base 31 can be provided on a side of lower through-hole 38B. In some examples valve base 31 can be metallic, comprising copper or tungsten formed on the side of lower through-hole 38B, or a nickel-gold plating. In some examples, valve base 31 can be provided in a similar manner to conductive structure 111 described above. Valve base 31 can have a thickness in the range from about 10 μm to about 50 μm.

Figure 7B:
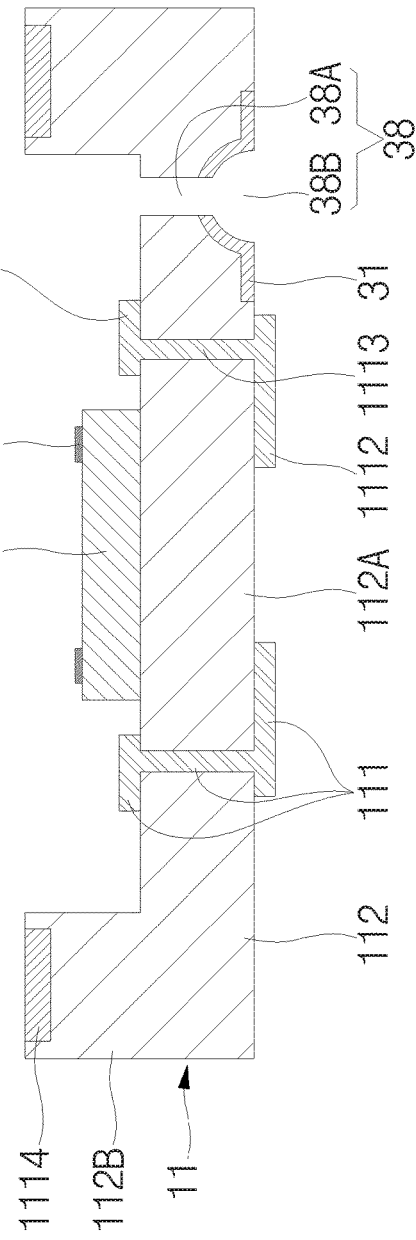

FIG. 7B shows a cross-sectional view of semiconductor device 30 at a later stage of manufacture. In the example shown in FIG. 7B, electronic component 15 can be provided on cavity substrate 11. In some examples, electronic component 15 can be attached onto base 112A of cavity substrate 11 using an adhesive or a thermally conductive material.

FIG. 7C shows a cross-sectional view of semiconductor device 30 at a later stage of manufacture. In the example shown in FIG. 7C, interconnect 14 can be provided between electronic component 15 and cavity substrate 11.

FIGS. 7D and 7E show a cross-sectional view of semiconductor device 30 at a later stage of manufacture. In the example shown in FIGS. 7D and 7E, lid 13 can be provided on cavity substrate 11. A bottom side of lid 13 can be attached on sidewall 112B of cavity substrate 11 using seal 16. In some examples, the bottom side of lid 13 can be attached to seal base 1114 provided on sidewall 112B.

FIG. 7F shows a cross-sectional view of semiconductor device 30 at a later stage of manufacture. In the example shown in FIG. 7F, cavity substrate 11 can be flipped such that lower through-hole 38B provided on base 112A faces upward.

Figure 7G:
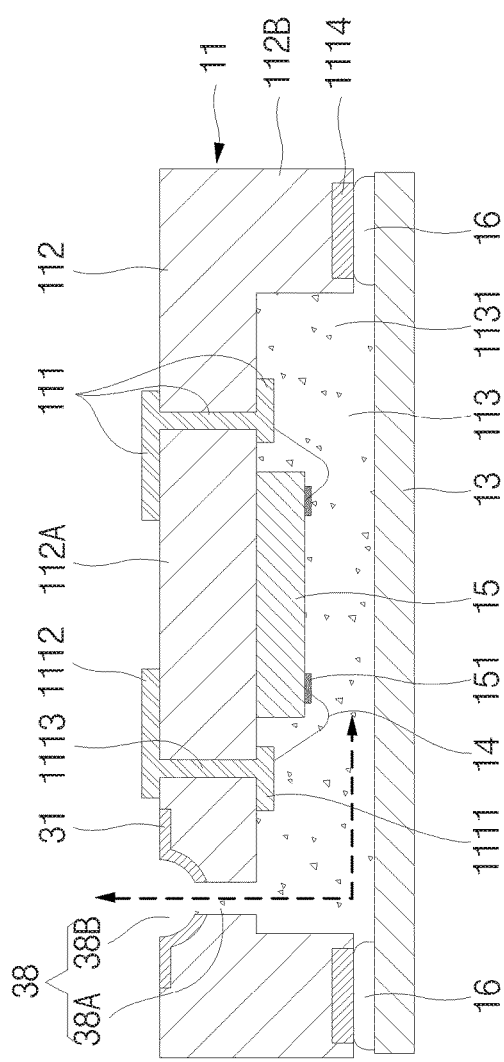

FIG. 7G shows a cross-sectional view of semiconductor device 30 at a later stage of manufacture. In the example shown in FIG. 7G, air in cavity 113 can be discharged from cavity 113 through valve 38, or a gas such as an inert gas or air can be introduced into cavity 113 through valve 38 to a target pressure.

Figure 7H:
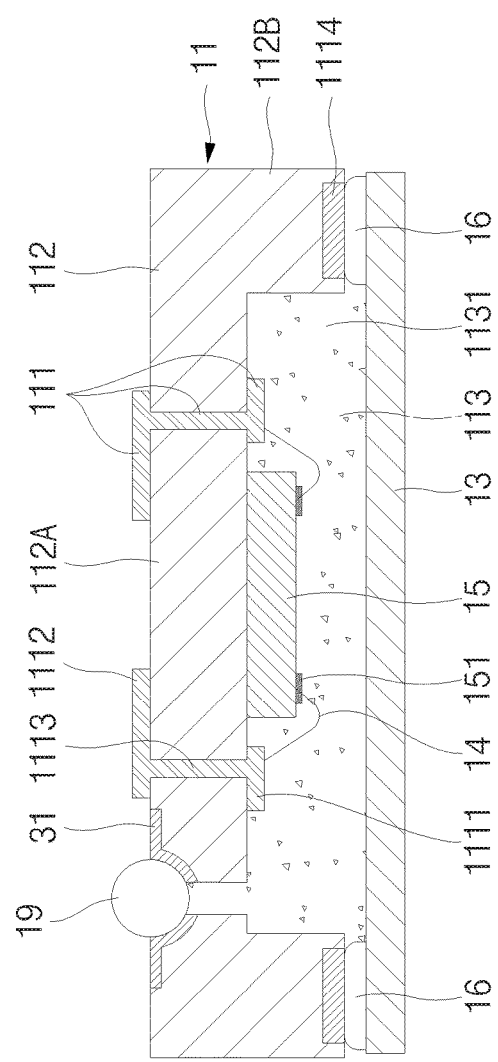

FIG. 7H shows a cross-sectional view of semiconductor device 30 at a later stage of manufacture. In the example shown in FIG. 7H, plug 19 can be provided at valve 38 provided on base 112A. In some examples, plug 19 can be positioned on bowl-shaped lower through-hole 38B or valve base 31. Accordingly, valve 38 can be occluded by plug 19.

Figure 7I:
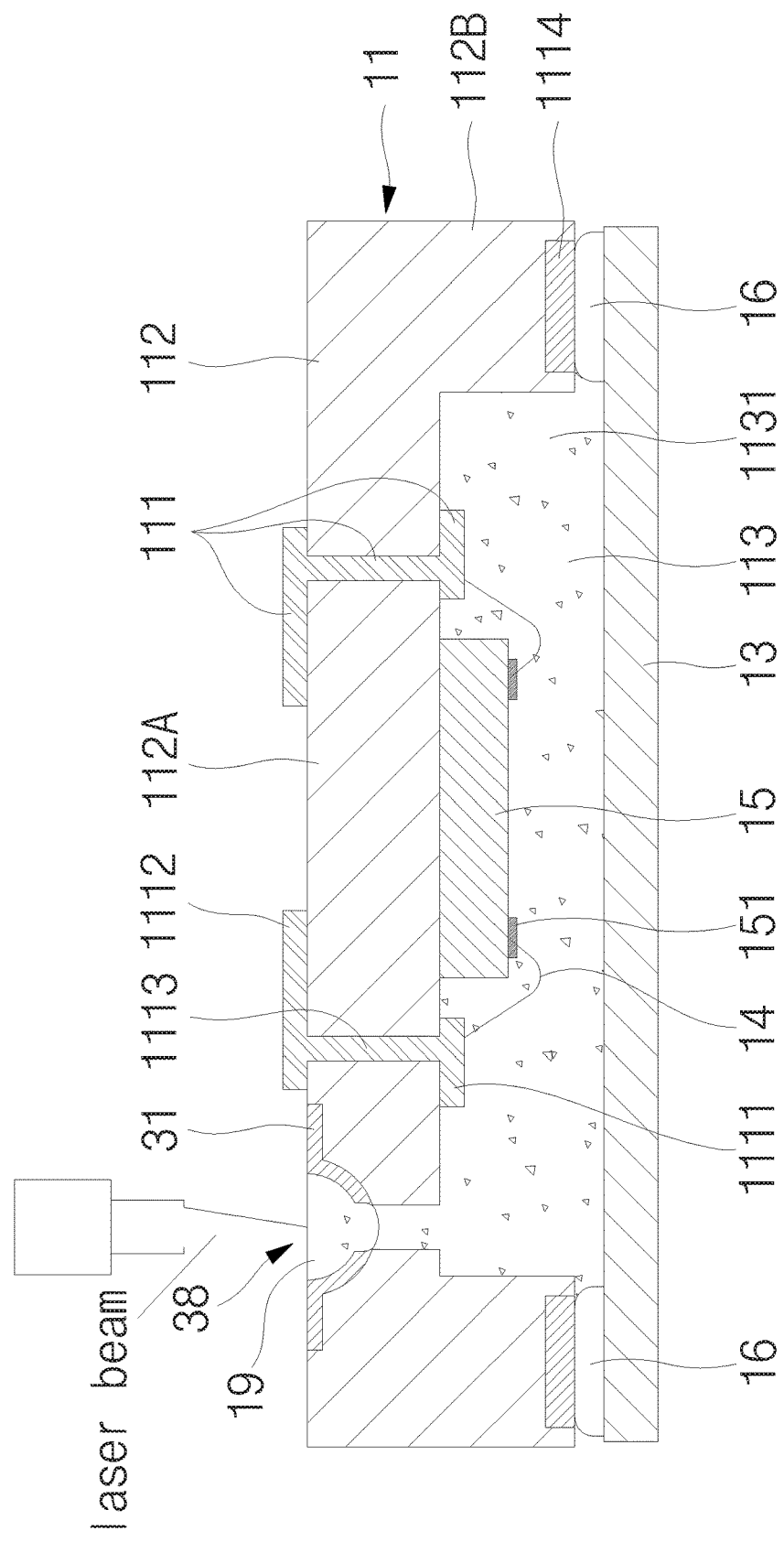

FIG. 7I shows a cross-sectional view of semiconductor device 30 at a later stage of manufacture. In the example shown in FIG. 7I, valve 38 can be occluded hermetically by melting plug 19, or by performing a forced insertion or bolting of plug 19, at lower through-hole 38B.

Figure 8:
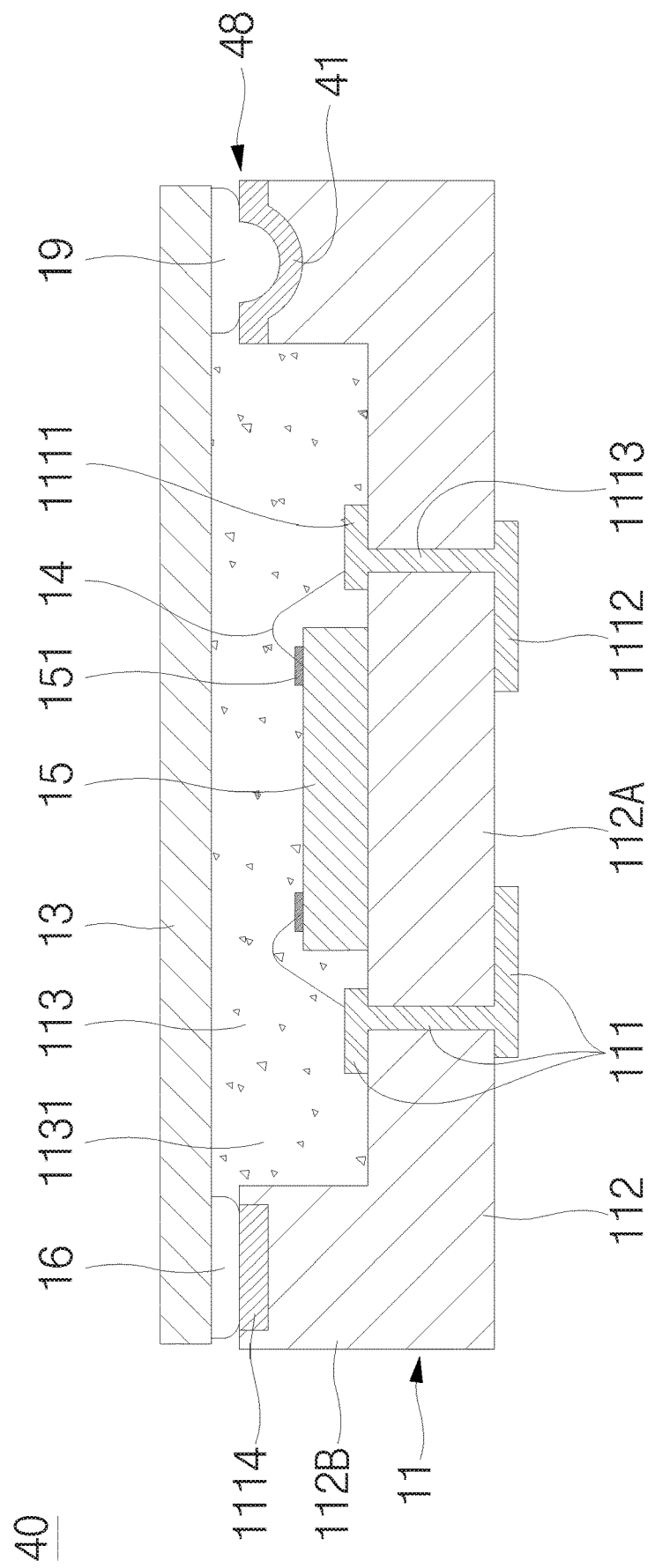
FIG. 8 shows a cross-sectional view of an example semiconductor device.

FIG. 8 shows a cross-sectional view of an example semiconductor device 40. Example semiconductor device 40 shown in FIG. 8 can be similar to example semiconductor device 10 shown in FIG. 1, and valve 48, including valve base 41, is provided between cavity substrate 11 and lid 13. In the example shown in FIG. 8, semiconductor device 40 can be configured such that valve 48 is positioned between sidewall 112B of cavity substrate 11 and lid 13. Semiconductor device 40 can comprise plug 19 occluding valve 48.

FIGS. 9A to 9H show cross-sectional views of an example method for manufacturing an example semiconductor device 40. The manufacturing method of example semiconductor device 40 shown in FIGS. 9A to 9H can be similar to corresponding operations or figures described in FIGS. 2A to 2H, for example for semiconductor device 10. FIGS. 9A to 9H, however, show that valve 48 is positioned between cavity substrate 11 and lid 13. The following description will focus on differences between both methods.

Figure 9A:
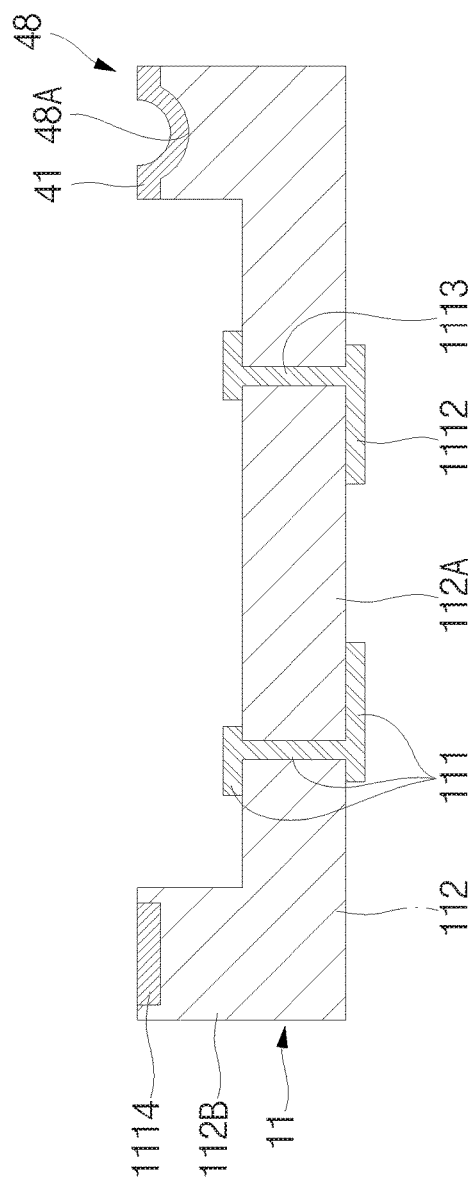

FIG. 9A shows a cross-sectional view of semiconductor device 40 at an early stage of manufacture. In the example shown in FIG. 9A, cavity substrate 11 can be provided. Cavity substrate 11 can comprise base 112A and sidewall 112B, and valve 48 can be provided at a top of sidewall 112B. Valve 48 can comprise or have groove 48A recessed on sidewall 112B. In some examples, groove 48A can have a bowl-shaped cross section. Groove 48A can be provided by performing a chemical etching process, a laser beam process, or a mechanical drilling process on the region of sidewall 112B.

In some examples, valve 48 can further comprise valve base 41 provided on a side of groove 48A. Valve base 41 can also have a bowl-shaped cross section, like the side of groove 48A. In some examples, valve 48 can be connected to or can be part of seal base 1114, can be made of a material similar to that of seal base 1114, or can have a thickness similar to that of seal base 1114. In some examples, groove 48A can have a depth in the range from about 50 µm to about 200 µm. In some examples, valve base 41 can comprise copper or tungsten formed on the side of groove 48A, or a nickel-gold plating. Valve base 41 can have a thickness in the range from about 10 µm to about 50 µm.

Figure 9B:
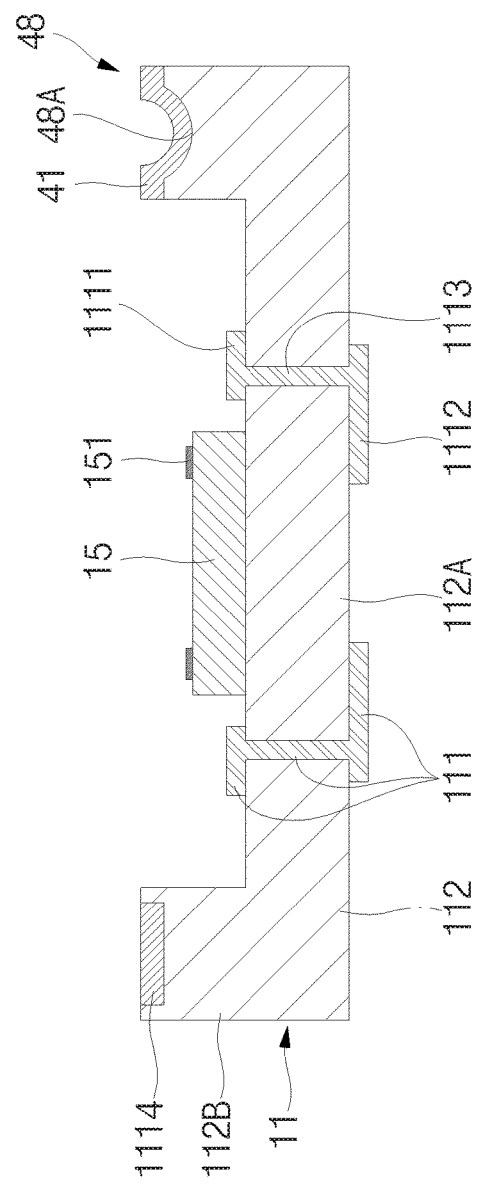

FIG. 9B shows a cross-sectional view of semiconductor device 40 at a later stage of manufacture. In the example shown in FIG. 9B, electronic component 15 can be provided on cavity substrate 11. In some examples, electronic component 15 can be attached onto base 112A of cavity substrate 11 using an adhesive or a thermally conductive material.

Figure 9C:
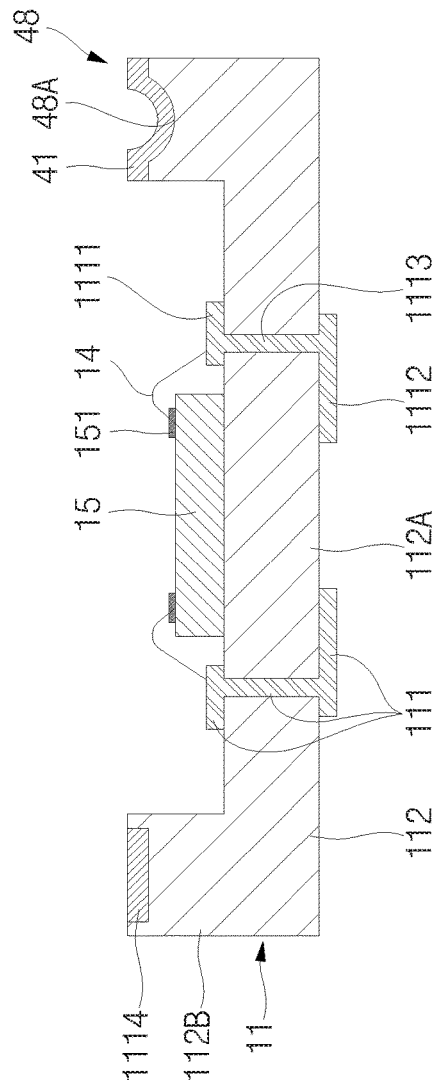

FIG. 9C shows a cross-sectional view of semiconductor device 40 at a later stage of manufacture. In the example shown in FIG. 9C, interconnect 14 can be provided between electronic component 15 and cavity substrate 11.

Figure 9D:
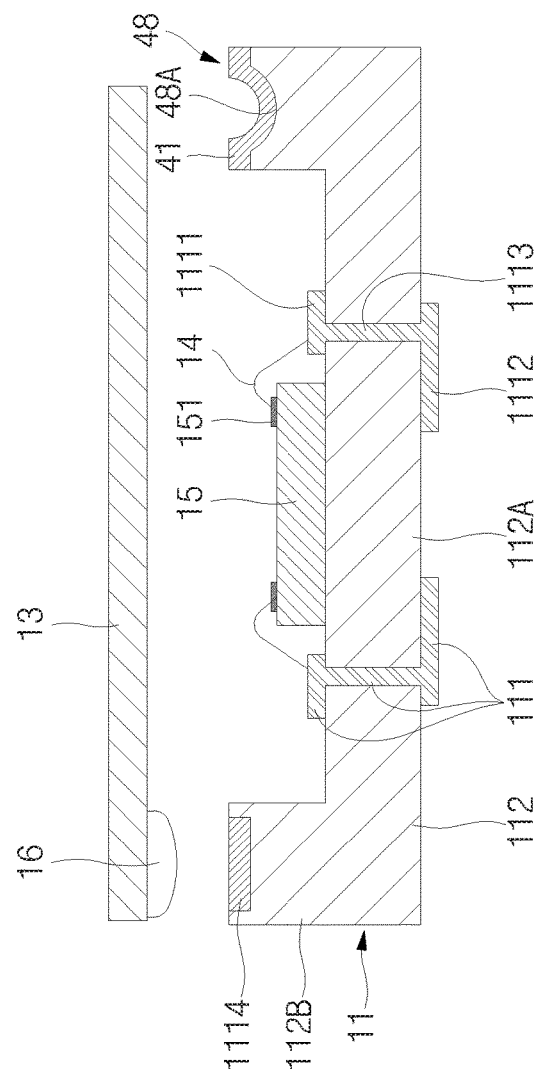

FIGS. 9D and 9E show a cross-sectional view of semiconductor device 40 at a later stage of manufacture. In the example shown in FIGS. 9D and 9E, lid 13 can be provided on cavity substrate 11. A bottom side of lid 13 can be attached onto sidewall 112B or seal base 1114 using seal 16. Seal 16 can comprise a gap between sidewall 112B and lid 13, and the gap can comprise or be defined valve 48. Valve 48 can have a width, including a width of the gap, in the range from about 50 µm to about 200 µm.

FIG. 9F shows a cross-sectional view of semiconductor device 40 at a later stage of manufacture. In the example shown in FIG. 9F, air in cavity 113 can be discharged from cavity 113 through valve 38, or a gas such as an inert gas or air can be introduced into cavity 113 through valve 38 to a target pressure.

Figure 9G:
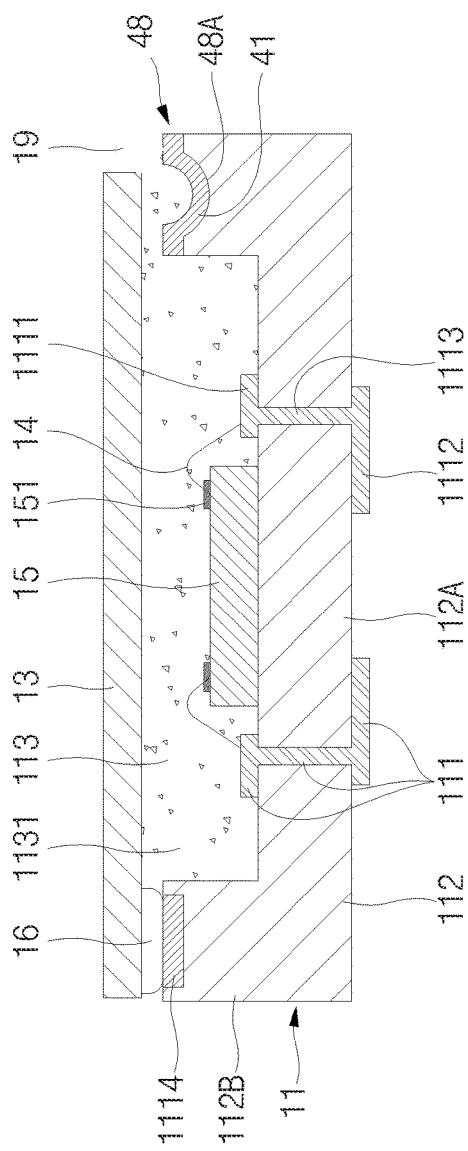

FIG. 9G shows a cross-sectional view of semiconductor device 40 at a later stage of manufacture. In the example shown in FIG. 9G, plug 19 can be provided at valve 48 positioned between cavity substrate 11 and lid 13. Plug 19 can be mounted on valve 48 positioned on sidewall 112B of cavity substrate 11. In some examples, plug 19 can be positioned at an entrance of valve 48 or on groove 48A. Accordingly, valve 48 can be occluded by plug 19.

Figure 9H:
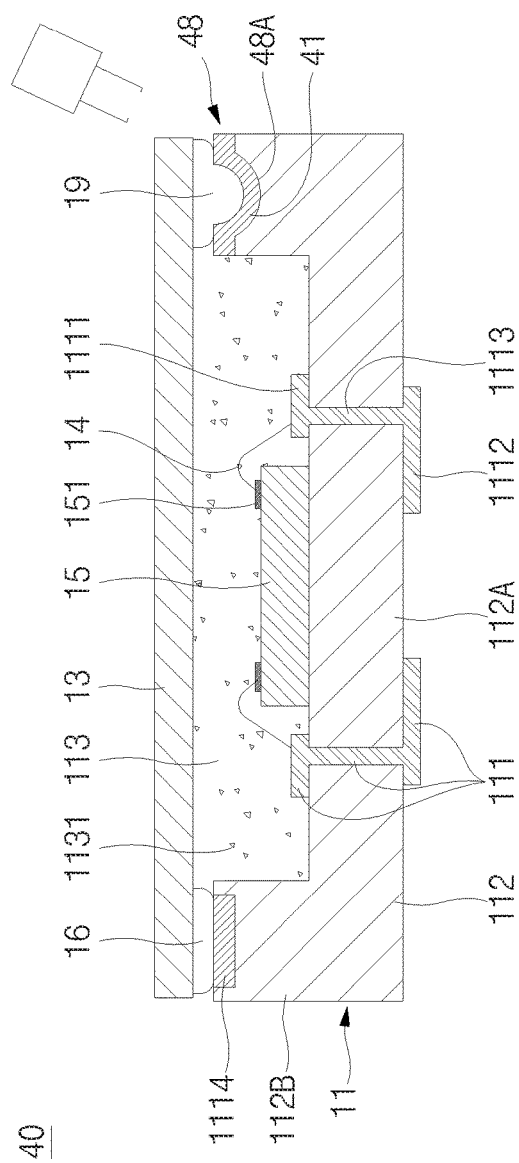

FIG. 9H shows a cross-sectional view of semiconductor device 40 at a later stage of manufacture. In the example shown in FIG. 9H, valve 48 can be occluded hermetically by melting plug 19 or by performing a forced insertion or bolting of plug 19 into valve 48 or groove 48A. In some examples, groove 48A of valve 48 can comprise or be referred to as a dam or dam perimeter configured to restrain plug 19 from lateral displacement or expansion. In some examples, plug 19 can be made of a material that is the same as or similar to that of seal 16.

Figure 10:
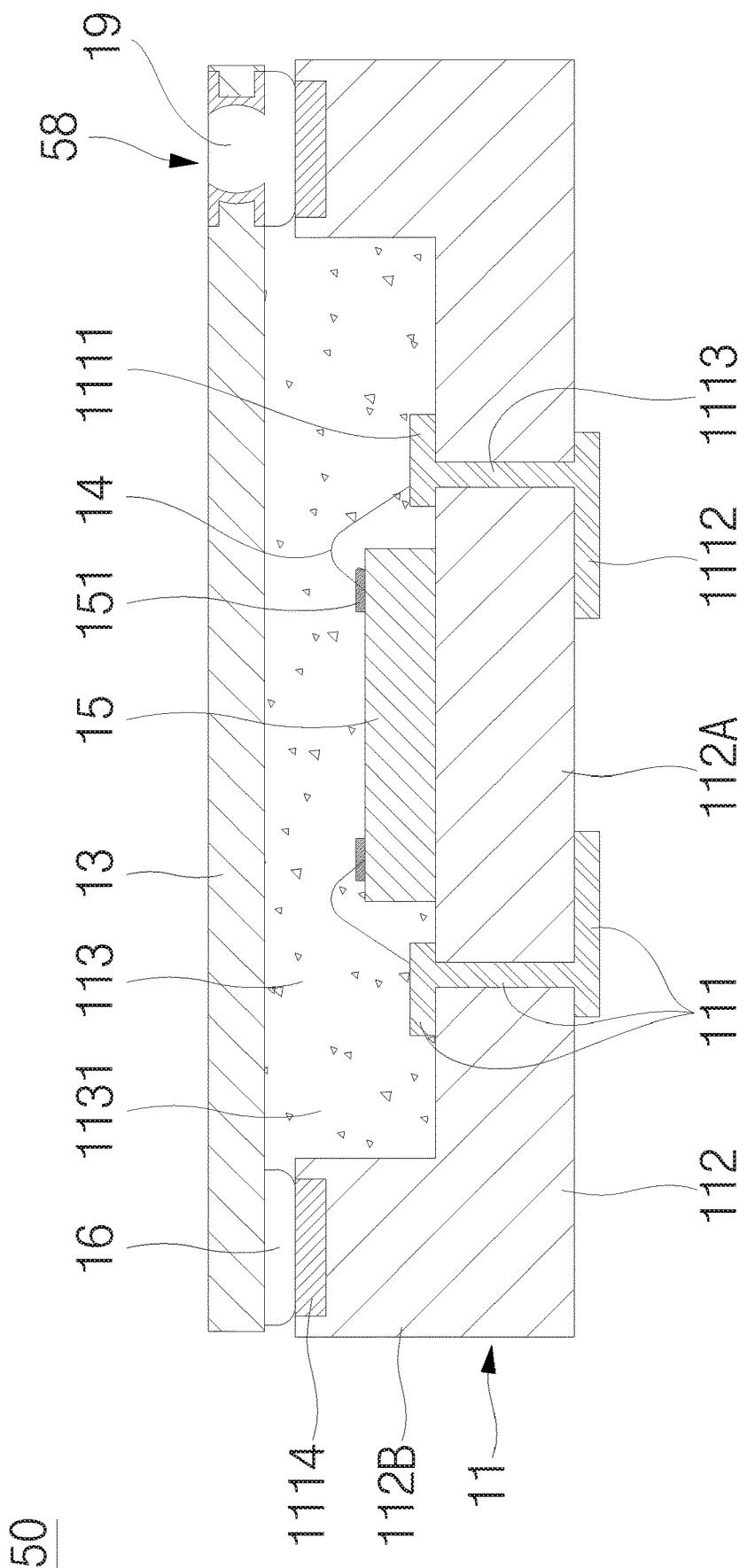
FIG. 10 shows a cross-sectional view of an example semiconductor device.

FIG. 10 shows a cross-sectional view of an example semiconductor device 50. Example semiconductor device 50 shown in FIG. 10 can be similar to example semiconductor device 10 shown in FIG. 1, and valve 58 is provided at lid 13, rather than at cavity substrate 11. In the example shown in FIG. 10, semiconductor device 50 can comprise lid 13 having valve 58. Valve 58 of lid 13 can further comprise valve base 51. Semiconductor device 50 can comprise plug 19 occluding valve 58 of lid 13.

FIGS. 11A to 11F show cross-sectional views of an example method for manufacturing an example semiconductor device 50. The manufacturing method of example semiconductor device 50 shown in FIGS. 11A to 11F can be similar to corresponding operations or figures described in FIGS. 2A to 2H, for example for semiconductor device 10. Valve 58, however, is provided on lid 13, rather than on cavity substrate 11. The following description will focus on differences between both methods.

FIG. 11A shows a cross-sectional view of semiconductor device 50 at an early stage of manufacture. In the example shown in FIG. 11A, lid 13 having valve 58 can be provided. Lid 13 can have a substantially planar top side and a substantially planar bottom side. Valve 58 comprising or having through-hole 58A passing through top and bottom sides of lid 13 can be provided. Through-hole 58A can be in lid 13 between lid 13 and sidewall 112B of cavity substrate 11. In some examples, valve 58 can be substantially circular or bowl-shaped. In some examples, through-hole 58A of valve 58 can be provided while passing through base 112A through a chemical etching process, a laser beam process, or a mechanical drilling process. In some examples, valve base 51 can further be provided on inner wall of through-hole 58A. In some examples, valve base 51 can be made of a material similar to that of seal base 1114. In some examples, valve base 51 can have a thickness in the range from about 10 µm to about 50 µm. Valve 58 provided on lid 13 can correspond to or be aligned with a region of seal base 1114 provided on cavity substrate 11.

Figure 11C:
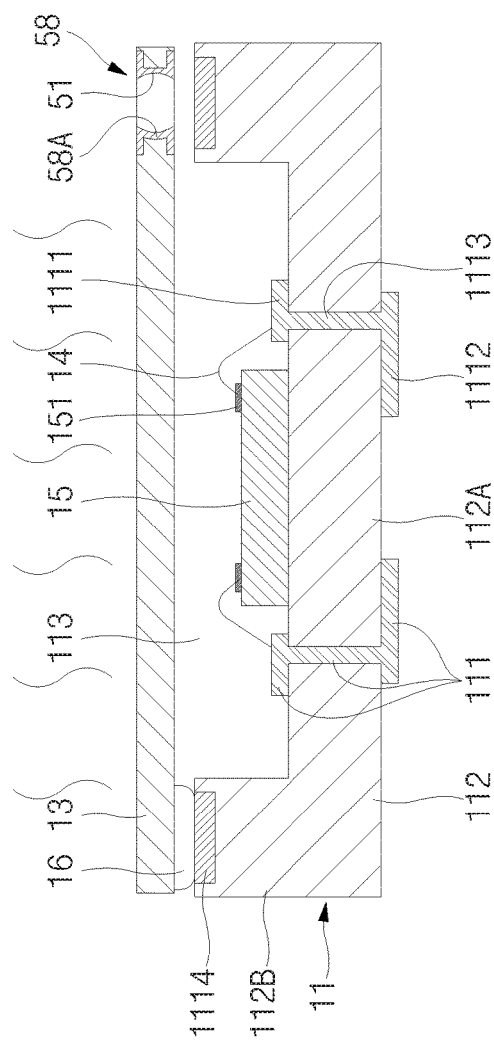

FIGS. 11B and 11C show a cross-sectional view of semiconductor device 50 at a later stage of manufacture. In the example shown in FIGS. 11B and 11C, lid 13 can be provided on cavity substrate 11. A bottom side of lid 13 can be attached to the top of sidewall 112B or seal base 1114 of cavity substrate 11 using seal 16. Seal 16 can be provided with a gap around valve 58, such that valve 58 is not occluded by seal 16.

Figure 11D:
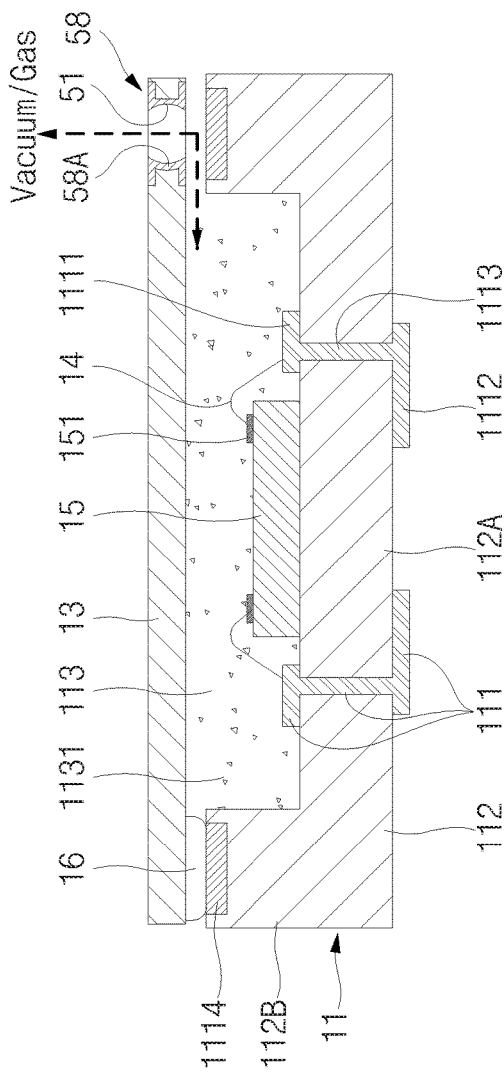

FIG. 11D shows a cross-sectional view of semiconductor device 50 at a later stage of manufacture. In the example shown in FIG. 11D, the air in cavity 113 can be discharged from cavity 113 through valve 58, or a gas such as an inert gas or air can be introduced into cavity 113 through valve 38 to a target pressure.

Figure 11E:
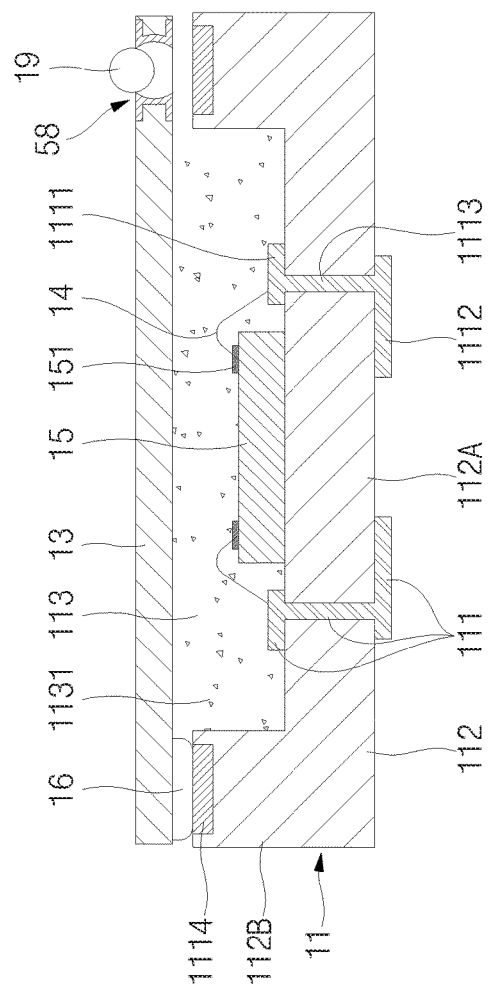

FIG. 11E shows a cross-sectional view of semiconductor device 50 at a later stage of manufacture. In the example shown in FIG. 11E, plug 19 can be provided at an entrance of valve 58, through lid 13, to occlude valve 58.

Figure 11F:
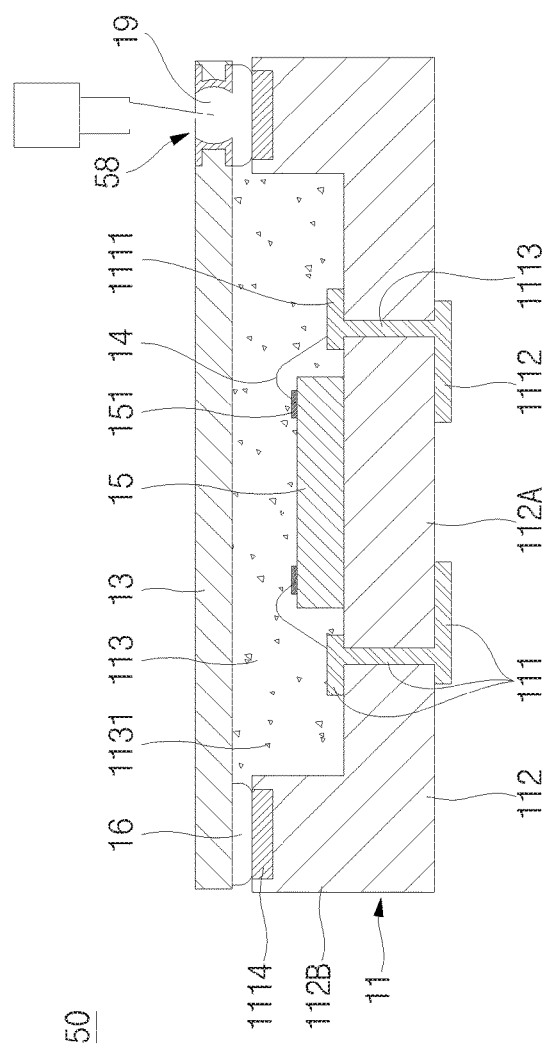

FIG. 11F shows a cross-sectional view of semiconductor device 50 at a later stage of manufacture. In the example shown in FIG. 11F, valve 58 provided in lid 13 and the gap created between lid 13 and cavity substrate 11 can be hermetically occluded by plug 19. In some examples, valve 58 and the gap can be occluded by melting plug 19, or by performing a forced insertion or bolting of plug 19 at valve 58.

FIG. 11F shows a cross-sectional view of semiconductor device 50 at a later stage of manufacture. In the example shown in FIG. 11F, valve 58 can be occluded hermetically by melting plug 19 or by performing a forced insertion or bolting of plug 19 into valve 58 or through-hole 58A. In some examples, plug 19 can be made of a material the same as or similar to that of seal 16.

The present disclosure includes reference to certain examples. It will be understood, however, by those skilled in the art that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
   a cavity substrate comprising a substrate base and a substrate sidewall protruding from the substrate base to define a cavity;
   an electronic component on a top side of the substrate base in the cavity;
   a lid over the cavity and over the substrate sidewall; and
   a valve to provide access to the cavity,
   wherein the valve has a plug to provide a seal between a cavity environment and an exterior environment outside the cavity, and
   wherein the valve is between a bottom side of the lid and a bottom side the substrate base.

2. The semiconductor device of claim 1, further comprising a seal base in the substrate sidewall and a seal between the seal base and the lid.

3. The semiconductor device of claim 1, wherein the cavity environment comprises a vacuum.

4. The semiconductor device of claim 1, wherein the cavity environment comprises an inert gas.

5. The semiconductor device of claim 1, wherein the valve is coupled through the substrate sidewall of the cavity substrate to the cavity.

6. The semiconductor device of claim 1, wherein the valve is between a top side of the substrate sidewall of the cavity substrate and the bottom side of the lid.

7. The semiconductor device of claim 1, wherein the valve comprises an aperture in the substrate base of the cavity substrate.

8. The semiconductor device of claim 1, wherein the valve comprises a groove in the substrate sidewall of the cavity substrate between the substrate sidewall and the lid.

9. The semiconductor device of claim 1, wherein the plug comprises solder.

10. The semiconductor device of claim 1, wherein the plug comprises a resin.

11. The semiconductor device of claim 1, wherein the valve comprises a dam, and the plug is positioned in the dam.

12. The semiconductor device of claim 1, wherein the valve comprises a tap and the plug occludes the tap.

13. The semiconductor device of claim 1, further comprising a conductive structure in the substrate base electrically coupled with the electronic component.

14. The semiconductor device of claim 1, wherein the valve is between the bottom side of the lid and a top side the substrate base.

15. The semiconductor device of claim 1, wherein the lid comprises a lid material, the valve comprises a valve material different than the lid material, and the plug comprises a plug material different from the lid material and the valve material.

16. A method, comprising:
   providing a cavity substrate comprising a substrate base and a substrate sidewall protruding from the substrate base to define a cavity;
   providing an electronic component on a top side of the substrate base in the cavity;
   providing a lid over the cavity contacting the substrate sidewall; and
   providing a valve to provide access to the cavity,
   wherein the valve has a plug to provide a seal between a cavity environment and an environment outside the cavity, and
   wherein the valve is between a bottom side of the lid and a bottom side the substrate base.

17. The method of claim 16, further comprising removing air from the cavity through the valve to provide a vacuum in the cavity environment prior to sealing the plug in the valve, and then sealing the plug in the valve.

18. The method of claim 16, further comprising adding an inert gas into the cavity through the valve prior to sealing the plug in the valve, and then sealing the plug in the valve.

19. The method of claim 16, further comprising sealing the plug in the valve using a laser.

20. A semiconductor device, comprising:
   a substrate comprising a substrate base and a substrate sidewall extending vertically from the substrate base;
   a lid over the substrate sidewall to define a cavity between the substrate base, the substrate sidewall, and the lid;
   an electronic component in the cavity;
   a valve between the cavity and an exterior environment outside the cavity;
   a seal between the lid and the substrate sidewall; and
   a plug in the valve,
   wherein the seal and the plug hermetically seal the cavity from the exterior environment, and
   wherein the valve is between a bottom side of the lid and a bottom side the substrate base.

21. The semiconductor device of claim 20, wherein:
   the valve includes a first through-hole and a second through-hole coupled to each other;
   a width of the second through-hole is greater than a width of the first through-hole; and
   the plug is in the second through-hole.

* * * * *